United States Patent
Karpov et al.

(10) Patent No.: US 12,261,114 B2
(45) Date of Patent: Mar. 25, 2025

(54) METALLIZATION STACKS WITH SELF-ALIGNED STAGGERED METAL LINES

(71) Applicant: Intel Corporation, Santa Clara, CA (US)

(72) Inventors: Elijah V. Karpov, Portland, OR (US); Christopher J. Jezewski, Portland, OR (US); Manish Chandhok, Beaverton, OR (US); Nafees A. Kabir, Portland, OR (US); Matthew V. Metz, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 974 days.

(21) Appl. No.: 17/017,735

(22) Filed: Sep. 11, 2020

(65) Prior Publication Data

US 2022/0084942 A1 Mar. 17, 2022

(51) Int. Cl.
*H01L 23/528* (2006.01)
*H01L 21/768* (2006.01)
*H01L 23/522* (2006.01)

(52) U.S. Cl.
CPC .... *H01L 23/5283* (2013.01); *H01L 21/76877* (2013.01); *H01L 23/5226* (2013.01)

(58) Field of Classification Search
CPC ......... H01L 27/0207; H01L 21/823871; H01L 2027/11875; H01L 21/76895; H01L 23/528; H01L 23/481; H01L 23/5386; H01L 23/5283; H01L 23/5226; H01L 23/6381; H01L 21/0334; H01L 21/76897; H01L 23/5222; H01L 21/76816;

(Continued)

(56) References Cited

U.S. PATENT DOCUMENTS 5,895,977 A  4/1999  Banerjee
6,518,670 B1  2/2003  Mandelman et al.
(Continued)

FOREIGN PATENT DOCUMENTS

DE  10245179  12/2012
EP  3439031 A1  2/2019

OTHER PUBLICATIONS

European Extended Search Report in European Patent Application No. 21186698.3 dated Jan. 26, 2022, 10 pages.

*Primary Examiner* — Alia Sabur
(74) *Attorney, Agent, or Firm* — Akona IP PC

(57) ABSTRACT

Methods for fabricating metallization stacks with one or more self-aligned staggered metal lines, and related semiconductor devices, are disclosed. Methods and devices are based on providing a spacer material conformal to bottom metal lines of a first layer of a metallization stack. By carefully designing parameters of the deposition process, the spacer material may be deposited in such a manner that, for each pair of adjacent bottom metal lines of the first layer, an opening in the spacer material is formed in a layer above the bottom metal lines (i.e., in the second layer of the metallization stack), the opening being substantially equidistant to the adjacent bottom metal lines of the first layer. Top metal lines are formed by filling the openings with an electrically conductive material, resulting in the top metal lines being self-aligned and staggered with respect to the bottom metal lines.

22 Claims, 20 Drawing Sheets

(58) Field of Classification Search
CPC ..... G06F 30/39; H10B 12/488; H10B 12/482; H10B 12/48
See application file for complete search history.

(56) References Cited

U.S. PATENT DOCUMENTS

| | | |
|---|---|---|
| 9,502,350 B1 | 11/2016 | Bonilla et al. |
| 10,332,899 B2 | 6/2019 | Xu et al. |
| 2001/0044199 A1* | 11/2001 | Miyai ................... H10B 12/485 257/784 |
| 2003/0210103 A1* | 11/2003 | Park .................... H01L 23/5283 257/E23.152 |
| 2008/0182407 A1* | 7/2008 | Zhai .................. H01L 23/53238 257/E23.145 |
| 2009/0184429 A1* | 7/2009 | Thies ................... H01L 21/7682 438/618 |
| 2013/0069244 A1* | 3/2013 | Blatchford ........ H01L 21/76811 257/E21.578 |
| 2013/0292841 A1* | 11/2013 | Lai ..................... H01L 23/5283 257/E21.586 |
| 2015/0137377 A1* | 5/2015 | Bao .................. H01L 21/76849 257/758 |
| 2015/0270211 A1* | 9/2015 | Kobrinsky ........ H01L 21/76874 257/758 |
| 2017/0133365 A1* | 5/2017 | Lim ...................... H01L 23/528 |
| 2017/0323902 A1 | 11/2017 | Zeng et al. |
| 2018/0261536 A1* | 9/2018 | Zhang ............... H01L 21/76801 |
| 2019/0043804 A1* | 2/2019 | Qian ................. H01L 21/76805 |

* cited by examiner

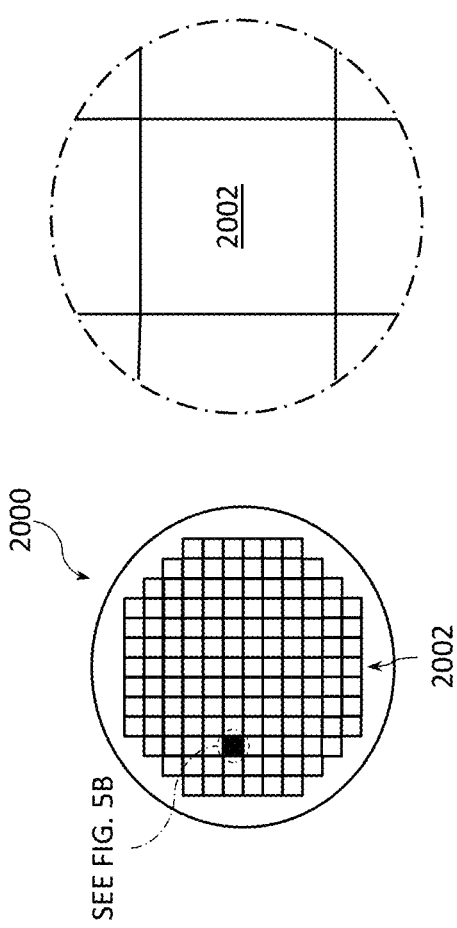

METALLIZATION STACKS WITH SELF-ALIGNED STAGGERED METAL LINES

TECHNICAL FIELD

This disclosure relates generally to the field of semiconductor devices, and more specifically, to metallization stacks with self-aligned staggered metal lines.

BACKGROUND

For the past several decades, the scaling of features in integrated circuits has been a driving force behind an ever-growing semiconductor industry. Scaling to smaller and smaller features enables increased densities of functional units on the limited real estate of semiconductor chips. For example, shrinking transistor size allows for the incorporation of an increased number of memory or logic devices on a chip, lending to the fabrication of products with increased capacity. The drive for the ever-increasing capacity, however, is not without issue. The necessity to optimize the performance of each device and each interconnect becomes increasingly significant.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, and not by way of limitation, in the figures of the accompanying drawings.

FIGS. 5A and 5B are top views of, respectively, a wafer and dies that may include one or more metallization stacks with self-aligned staggered metal lines, in accordance with various embodiments.

DETAILED DESCRIPTION

Overview

Figure 1A:
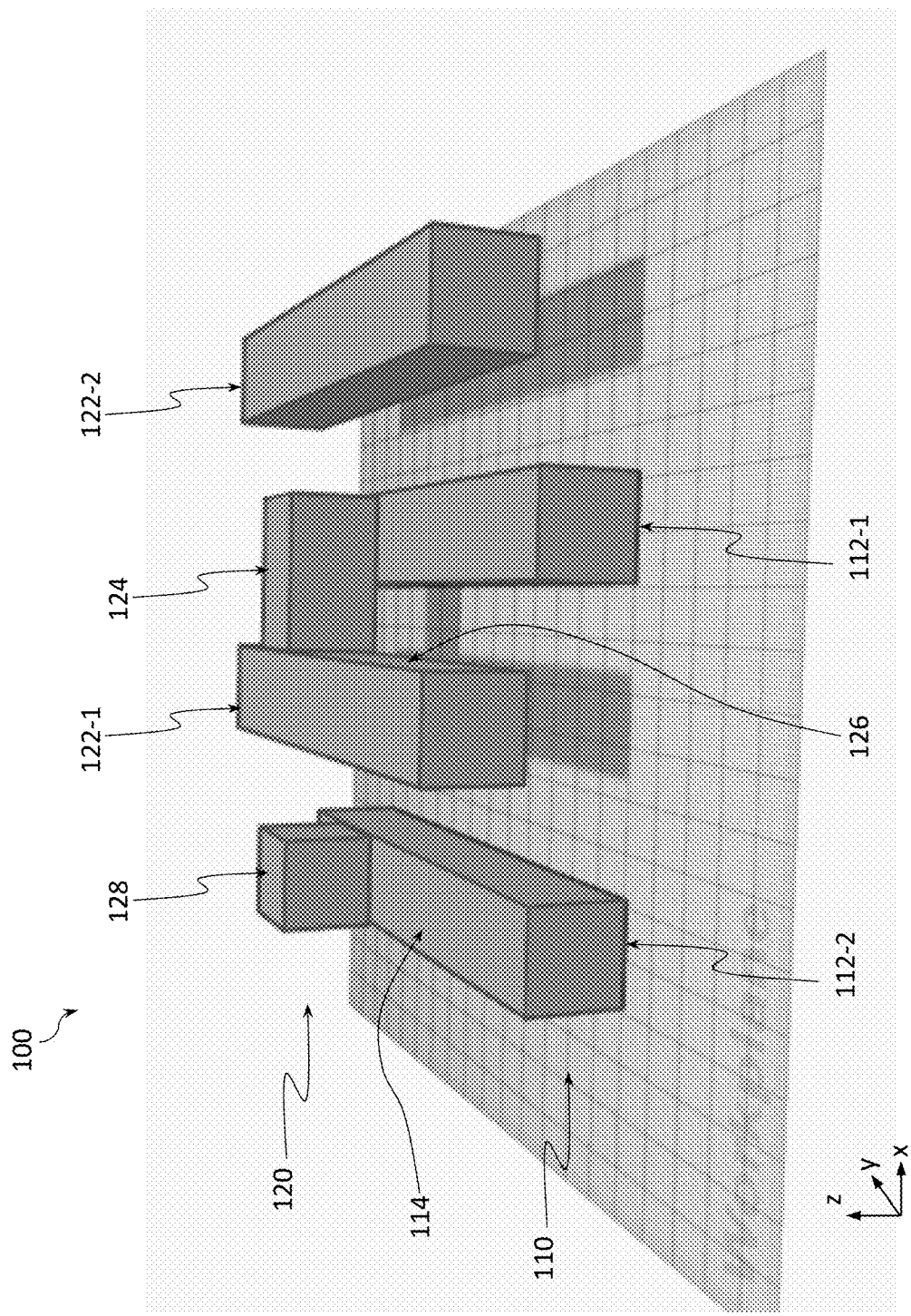
FIGS. 1A-1C provide different perspective views of an example metallization stack with self-aligned staggered metal lines, in accordance with some embodiments.

The systems, methods and devices of this disclosure each have several innovative aspects, no single one of which is solely responsible for all desirable attributes disclosed herein. Details of one or more implementations of the subject matter described in this specification are set forth in the description below and the accompanying drawings.

For purposes of illustrating metallization stacks with self-aligned staggered metal lines integrated in the integrated in the back-end-of-line (BEOL) as described herein it might be useful to first understand phenomena that may come into play during IC fabrication. The following foundational information may be viewed as a basis from which the present disclosure may be properly explained. Such information is offered for purposes of explanation only and, accordingly, should not be construed in any way to limit the broad scope of the present disclosure and its potential applications.

ICs commonly include electrically conductive microelectronic structures, known in the art as interconnects, to provide electrical connectivity between various components. In this context, the term "metallization stack" may be used to describe a stacked series of layers of electrically conductive wires (sometimes referred to as "metal lines") which are electrically insulated from one another except for when/where they may need to be electrically connected. In a conventional metallization stack, electrical connections between metal lines of different layers of a metallization stack are realized by means of vias filled with one or more electrically conductive materials, extending in a direction substantially perpendicular to the planes of the metal lines (i.e., extending in a vertical direction of the plane of the metal lines is considered a horizontal plane).

In the past, the sizes and the spacing of interconnects such as metal lines and vias have progressively decreased, and it is expected that in the future the sizes and the spacing of the interconnects will continue to progressively decrease, for at least some types of ICs (e.g., advanced microprocessors, chipset components, graphics chips, etc.). One measure of a size of a metal line is the critical dimension of the line width. One measure of the spacing of the metal lines is the line pitch, representing the center-to-center distance between the closest adjacent metal lines of a given layer of a metallization stack.

Low level interconnect technology for semiconductor manufacturing demands smaller and smaller pitch as well as higher and higher aspect ratio interconnects. Both trends increase capacitance and signal delay due to the close proximity of metal lines provided side-by-side to each other (i.e., due to the small pitch of the metal lines). Furthermore, the smaller and smaller line pitch often results in decreased metal line width. Consequently, the area of a conventional via connecting to the top or the bottom of such a metal line is correspondingly smaller. Smaller cross-sectional area of a conventional via connecting to the top or the bottom of a narrow metal line results in increased via resistance.

Current approaches to solving the challenge of increased capacitance include using dielectrics having dielectric constants that are as low as possible, as well as using airgap technology (where airgaps may be introduced to further decrease the dielectric constant of a material). Finding a solution to the challenge of decrease in via's area as line pitch decreases is often even more difficult.

Disclosed herein are methods for fabricating an IC structure, e.g., for fabricating a metallization stack portion of an IC structure, the metallization stack including one or more self-aligned staggered metal lines, which may be integrated in the back end of line (BEOL) layer, provided over a support structure (e.g., a substrate, a wafer, or a chip), as well as related semiconductor devices. Methods and devices (including the IC structures) disclosed herein are based on providing a layer of a spacer material conformal to the plurality of bottom metal lines of a first layer of a metallization stack. By carefully designing parameters of the deposition process, the spacer material may be deposited in such a manner that, for each pair of adjacent bottom metal lines of the first layer of the metallization stack, an opening in the spacer material is formed in a layer above the bottom metal lines (i.e., in a layer that may be considered to be a second layer of the metallization stack), the opening being substantially equidistant to the adjacent bottom metal lines of the first layer. Top metal lines may then be formed by filling the openings with an electrically conductive material. In this manner, the top metal lines may be self-aligned and staggered with respect to the bottom metal lines. Staggering of the metal lines may advantageously allow increasing the distance between metal lines closest to one another, therefore decreasing the capacitance between various metal lines. Furthermore, such an approach may advantageously allow realizing electrical connectivity between a bottom metal line and a top metal line (i.e., between metal lines of different layers of the metallization stack) by means of an interconnect that connects to a sidewall of either the bottom or the bottom metal line. Since, typically, a height (i.e., a dimension measured in a direction substantially perpendicular to the support structure, e.g., a dimension measured along the z-axis of the example coordinate system shown in the present drawings) of metal lines of a metallization stack is larger than their width (i.e., a dimension measured in a direction substantially parallel to the support structure, e.g., a dimension measured along the x-axis of the example coordinate system shown in the present drawings), having an interconnect that is coupled to a sidewall of either the bottom or the bottom metal line may advantageously result in lowered resistance associated with the interconnect by increasing the overlap area. For such an interconnect, a dimension measured in a plane substantially perpendicular to the support structure may be smaller than a dimension of the interconnect measured in a plane substantially parallel to the support structure. Therefore, such an interconnect is referred to in the following as a "horizontal via." Methods and devices described herein may provide improvements in terms of one or more of reducing the misalignment between various metal lines and vias, reducing the RC delays, and increasing reliability in the final IC structures.

As used herein, the term "bottom metal line" refers to any electrically conductive structure/line that is provided in a layer of a metallization stack that is closer to the support structure than another layer of the metallization stack, while the term "top metal line" refers to any electrically conductive structure/line that is provided in the layer of the metallization stack that is above the layer of the bottom metal lines. In other words, the bottom metal lines are provided in a layer of the metallization stack that is between the support structure and the layer in which the top metal lines are provided. In various embodiments, such bottom and top metal lines may include electrically conductive structures other than lines/trenches (e.g., at least a portion of the bottom metal line may be a gate contact), and/or may be formed, or include, electrically conductive materials other than metals.

IC structures as described herein, in particular metallization stacks with self-aligned staggered metal lines integrated in the BEOL as described herein, may be used for providing electrical connectivity to one or more components associated with an IC or/and between various such components. In various embodiments, components associated with an IC include, for example, transistors, diodes, power sources, resistors, capacitors, inductors, sensors, transceivers, receivers, antennas, etc. Components associated with an IC may include those that are mounted on IC or those connected to an IC. The IC may be either analog or digital and may be used in a number of applications, such as microprocessors, optoelectronics, logic blocks, audio amplifiers, etc., depending on the components associated with the IC. The IC may be employed as part of a chipset for executing one or more related functions in a computer.

For purposes of explanation, specific numbers, materials and configurations are set forth in order to provide a thorough understanding of the illustrative implementations. However, it will be apparent to one skilled in the art that the present disclosure may be practiced without the specific details or/and that the present disclosure may be practiced with only some of the described aspects. In other instances, well-known features are omitted or simplified in order not to obscure the illustrative implementations.

Further, references are made to the accompanying drawings that form a part hereof, and in which is shown, by way of illustration, embodiments that may be practiced. It is to be understood that other embodiments may be utilized, and structural or logical changes may be made without departing from the scope of the present disclosure. Therefore, the following detailed description is not to be taken in a limiting sense. For convenience, if a collection of drawings designated with different letters are present, e.g., FIGS. 4A-4D, such a collection may be referred to herein without the letters, e.g., as "FIG. 4."

In the drawings, some schematic illustrations of example structures of various devices and assemblies described herein may be shown with precise right angles and straight lines, this is simply for ease of illustration, and embodiments of these assemblies may be curved, rounded, or otherwise irregularly shaped as dictated by, and sometimes inevitable due to, the manufacturing processes used to fabricate semiconductor device assemblies. Therefore, it is to be understood that such schematic illustrations may not reflect real-life process limitations which may cause the features to not look so "ideal" when any of the structures described herein are examined using e.g., scanning electron microscopy (SEM) images or transmission electron microscope (TEM) images. In such images of real structures, possible processing defects could also be visible, e.g., not-perfectly straight edges of materials, tapered vias or other openings, inadvertent rounding of corners or variations in thicknesses of different material layers, occasional screw, edge, or combination dislocations within the crystalline region, and/or occasional dislocation defects of single atoms or clusters of atoms. There may be other defects not listed here but that are common within the field of device fabrication. Inspection of layout and mask data and reverse engineering of parts of a device to reconstruct the circuit using e.g., optical microscopy, TEM, or SEM, and/or inspection of a cross-section of a device to detect the shape and the location of various device elements described herein using e.g., Physical Failure Analysis (PFA) would allow determination of presence of one or more metallization stacks with self-aligned staggered metal lines as described herein.

Various operations may be described as multiple discrete actions or operations in turn, in a manner that is most helpful in understanding the claimed subject matter. However, the order of description should not be construed as to imply that these operations are necessarily order dependent. These operations may not be performed in the order of presentation. Operations described may be performed in a different order from the described embodiment. Various additional operations may be performed, and/or described operations may be omitted in additional embodiments.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C). The term "between," when used with reference to measurement ranges, is inclusive of the ends of the measurement ranges.

The description uses the phrases "in an embodiment" or "in embodiments," which may each refer to one or more of the same or different embodiments. The terms "comprising," "including," "having," and the like, as used with respect to embodiments of the present disclosure, are synonymous. The disclosure may use perspective-based descriptions such as "above," "below," "top," "bottom," and "side"; such descriptions are used to facilitate the discussion and are not intended to restrict the application of disclosed embodiments. The accompanying drawings are not necessarily drawn to scale. Unless otherwise specified, the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

In the following detailed description, various aspects of the illustrative implementations will be described using terms commonly employed by those skilled in the art to convey the substance of their work to others skilled in the art. For example, if used, the terms "oxide," "carbide," "nitride," etc. refer to compounds containing, respectively, oxygen, carbon, nitrogen, etc., the term "high-k dielectric" refers to a material having a higher dielectric constant than silicon oxide, while the term "low-k dielectric" refers to a material having a lower dielectric constant than silicon oxide. In another example, a term "interconnect" is used to describe any element formed of an electrically conductive material for providing electrical connectivity to one or more components associated with an IC or/and between various such components. In general, the "interconnect" may refer to both trench contacts (also sometimes referred to as "lines") and vias. In general, a term "trench contact" is used to describe an electrically conductive element isolated by a dielectric material typically comprising an interlayer low-k dielectric that is provided within the plane of an IC chip. Such trench contacts are typically stacked into several levels, or several layers of metallization stacks. On the other hand, the term "via" is used to describe an electrically conductive element that interconnects two or more trench contacts of different levels. To that end, conventional vias may be provided substantially perpendicularly to the plane of an IC chip, while horizontal vias as described herein may be provided substantially parallel to the plane of an IC chip. A via may interconnect two trench contacts in adjacent levels or two trench contacts in not adjacent levels. A term "metallization stack" refers to a stack of one or more interconnects for providing connectivity to different circuit components of an IC chip. The terms "substantially," "close," "approximately," "near," and "about," generally refer to being within +/−20% of a target value based on the context of a particular value as described herein or as known in the art.

Example Metallization Stack with Self-Aligned Staggered Metal Lines

Figure 1B:
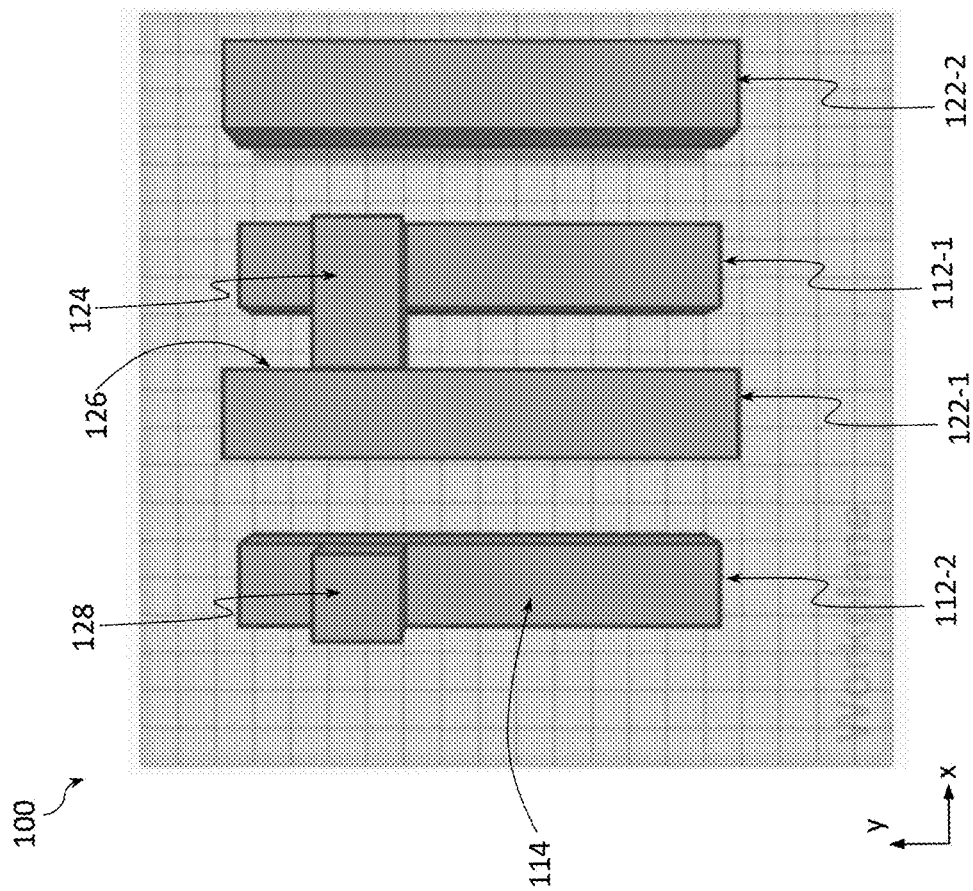
Figure 1C:
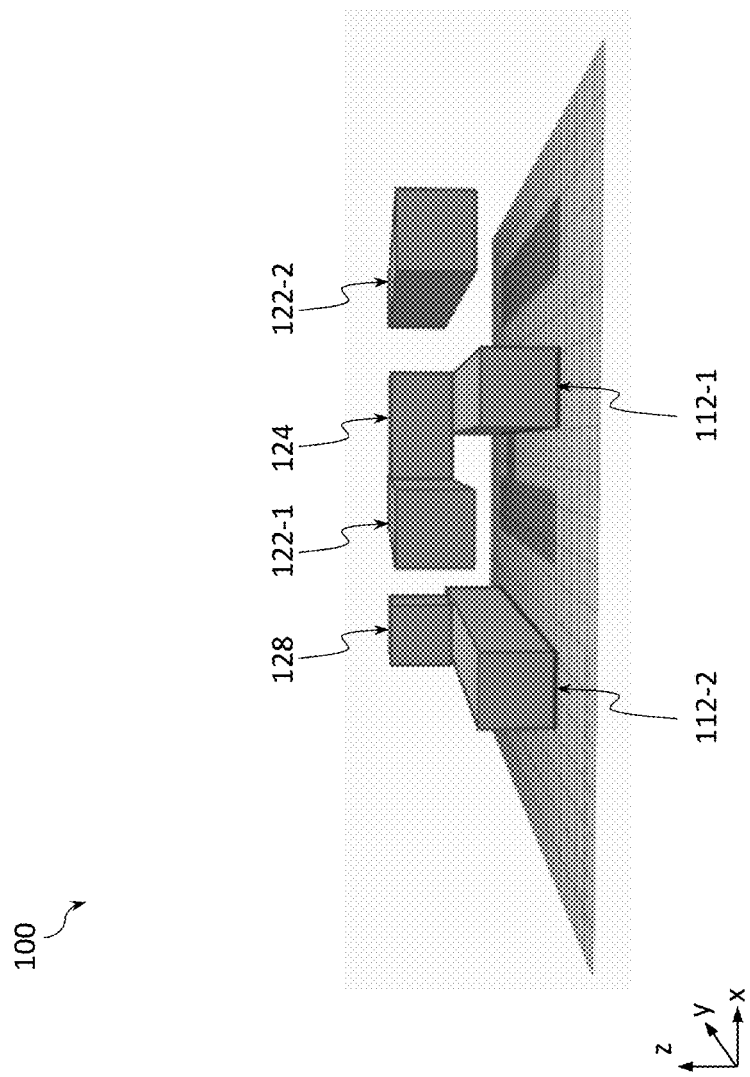

FIGS. 1A-1C provide different perspective views of an example IC structure with a metallization stack 100 with self-aligned staggered metal lines, in accordance with some embodiments. Although a certain number of a given element are illustrated in FIGS. 1A-1C (e.g., two bottom metal lines, two top metal lines, and one horizontal via between one of the bottom metal lines and one of the top metal lines), this is simply for ease of illustration, and more, or less, than that number may be included in an IC structure that includes a metallization stack with self-aligned staggered metal lines according to various embodiments of the present disclosure. Still further, various views shown in FIGS. 1A-1C are intended to show relative arrangements of various elements therein. In other embodiments, various IC structures with a metallization stack with self-aligned staggered metal lines, or portions thereof, may include other elements or components that are not illustrated (e.g., transistor portions, various components that may be in electrical contact with any of the bottom metal line, the top metal line, and the horizontal via in between, etc.).

As shown in FIGS. 1A-1C, the metallization stack 100 may include a first metallization layer 110 and a second metallization layer 120, where the first metallization layer 110 may be between a support structure over which the metallization stack 100 may be provided and the second metallization layer 120 (i.e., the second metallization layer 120 may be stacked above the first metallization layer 110). The support structure not specifically shown in FIGS. 1A-1C although the plane labeled in FIGS. 1A-1C as a "Workplane" may be seen as a representation of the plane of the support structure. The first metallization layer 110 may include at least two bottom metal lines 112-1 and 112-2, which may be formed of a first electrically conductive material. The second metallization layer 120 may include at least one top metal line 122-1, but typically would include more than one, as shown with a second top metal line 122-2, which metal lines may be formed of a second electrically conductive material. As can be seen in FIGS. 1A-1C, the top metal lines 122 are staggered with respect to the bottom metal lines 112 in that projections of the bottom metal lines 112 and of the top metal lines 122 onto the support structure or the workplane are substantially parallel and the projection of each of the top metal lines 122 is between the projections of the pair of the bottom metal lines 112. Having one or more top metal lines 122 of the second metallization layer 120 being staggered with respect to one or more bottom metal lines 112 of the first metallization layer 110 may advantageously result in lowered capacitance between the lines of the metallization stack 100.

As further shown in FIGS. 1A-1C, the second metallization layer 120 may further include an interconnect 124, configured to provide electrical connectivity between the bottom metal line 112-1 and the top metal line 122-1. In particular, the interconnect 124 may be electrically coupled to a sidewall (i.e., a face that is substantially perpendicular to the support structure) 126 of the top metal line 122-1. Typically, a height (i.e., a dimension measured in a direction substantially perpendicular to the support structure, e.g., a dimension measured along the z-axis of the example coordinate system shown in the present drawings) of metal lines of a metallization stack, e.g., metallization stack 100, is larger than their width (i.e., a dimension measured in a direction substantially parallel to the support structure, e.g., a dimension measured along the x-axis of the example coordinate system shown in the present drawings). Although it is not specifically shown in FIGS. 1A-1C, metal lines having their heights larger than their widths are illustrated in FIGS. 3A-3H. For metal lines having their heights larger than their widths, having an interconnect that is coupled to a sidewall of one of the metal lines may advantageously result in lowered resistance between the interconnect and the metal line by increasing the area of their overlap. This is the case for the interconnect 124 coupled to the sidewall 126 of the top metal line 122-1 of the metallization stack 100.

In some embodiments, the metallization stack 100 may further include a conventional via, coupled to an upper face of one of the metal lines. For example, as shown in FIGS. 1A-1C, the metallization stack 100 may further include a conventional via 128, coupled to an upper face 114 of the bottom metal line 112-2.

As used herein, the terms "lower face" and "upper face" are used so that the lower face of a structure (e.g., a metal line) is a face that is closer to the support structure (e.g., the support structure 322 shown in FIGS. 3 and 4) than the upper face. The lower and upper faces of a structure are substantially parallel to one another and substantially parallel to the support structure. In contrast, a "sidewall" is a face of a structure (e.g., a metal line) that is substantially perpendicular to the support structure (subject to deviation due to fabrication processes which may result in a cross-sectional side view being a trapezoid as, e.g., shown in FIGS. 4B-4C, instead of a rectangle as, e.g., shown in FIGS. 3H and 4A).

Example Fabrication Method

Figure 2:
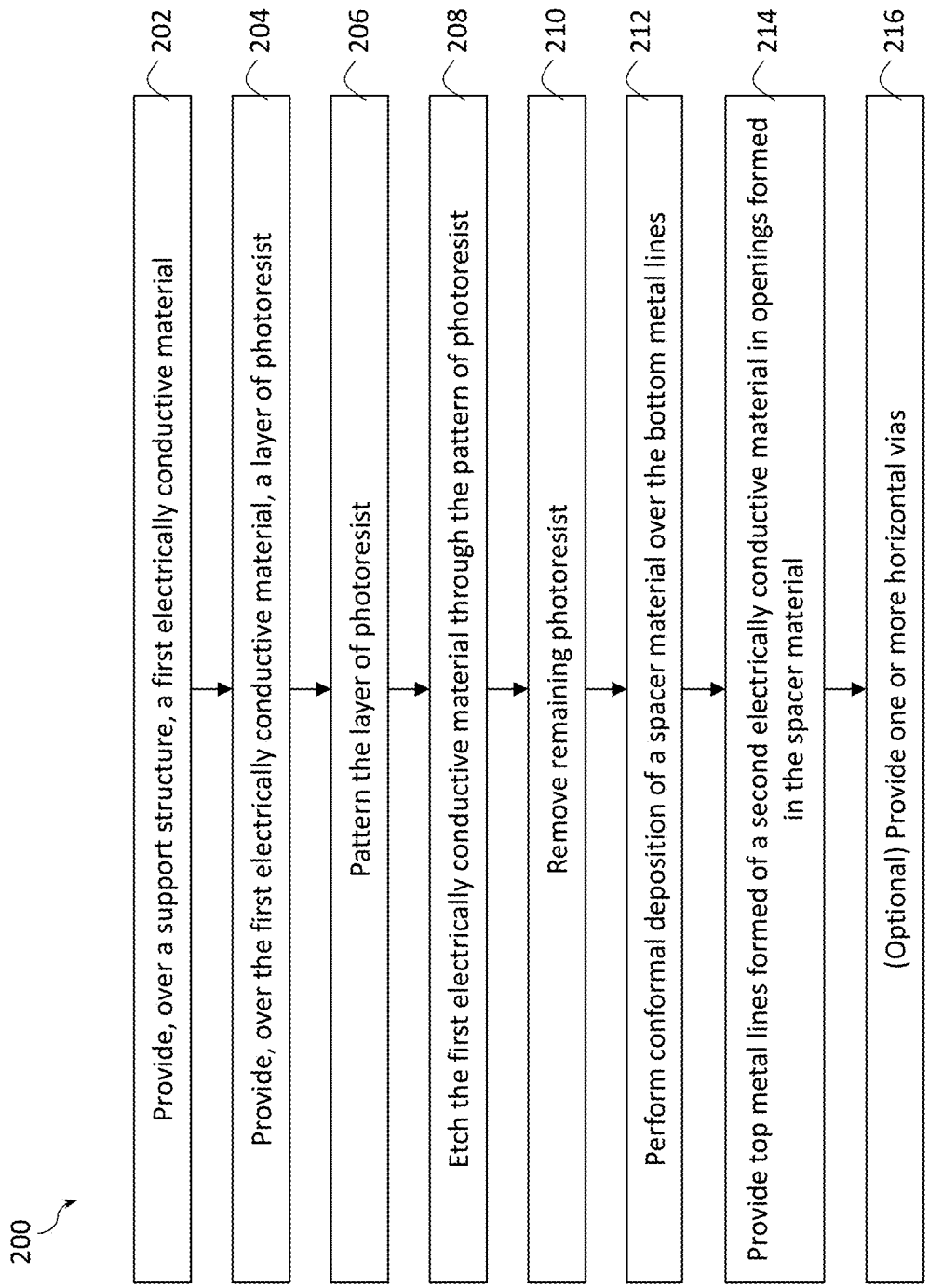
FIG. 2 is a flow diagram of an example method for providing a metallization stack with self-aligned staggered metal lines, in accordance with some embodiments.

FIG. 2 is a flow diagram of an example method 200 for providing a metallization stack with self-aligned staggered metal lines, e.g., the metallization stack 100, in accordance with some embodiments.

Although the operations of the method 200 are illustrated once each and in a particular order, the operations may be performed in any suitable order and repeated as desired. For example, one or more operations may be performed in parallel to manufacture, substantially simultaneously, multiple self-aligned staggered metal lines integrated in the BEOL as described herein. In another example, the operations may be performed in a different order to reflect the structure of a particular device assembly in which one or more metallization stacks with self-aligned staggered metal lines as described herein will be included.

In addition, the example manufacturing method 200 may include other operations not specifically shown in FIG. 2, such as various cleaning or planarization operations as known in the art. For example, in some embodiments, a support structure, as well as layers of various other materials subsequently deposited thereon, may be cleaned prior to, after, or during any of the processes of the method 200 described herein, e.g., to remove oxides, surface-bound organic and metallic contaminants, as well as subsurface contamination. In some embodiments, cleaning may be carried out using e.g., a chemical solutions (such as peroxide), and/or with ultraviolet (UV) radiation combined with ozone, and/or oxidizing the surface (e.g., using thermal oxidation) then removing the oxide (e.g., using hydrofluoric acid (HF)). In another example, the arrangements/devices described herein may be planarized prior to, after, or during any of the processes of the method 200 described herein, e.g., to remove overburden or excess materials. In some embodiments, planarization may be carried out using either wet or dry planarization processes, e.g., planarization be a chemical mechanical planarization (CMP), which may be understood as a process that utilizes a polishing surface, an abrasive and a slurry to remove the overburden and planarize the surface.

Various operations of the method 200 may be illustrated with reference to the example embodiments shown in FIGS. 3A-3H, illustrating cross-sectional side views and top-down views for various stages in the manufacture of an example IC structure (e.g., an IC structure 316, shown in FIG. 3H) that includes a metallization stack with self-aligned staggered metal lines according to the fabrication method 200, in accordance with some embodiments. For example, results of different processes of the method 200 are illustrated as an IC structure 302 shown in FIG. 3A as an example result of a process 202 of the method 200, an IC structure 304 shown in FIG. 3B as an example result of a process 204 of the method 200, and so on until an IC structure 316 shown in FIG. 3H as an example result of a process 216 of the method 200. In particular, the top illustration of each of FIGS. 3A-3H shows a cross-section side view of the IC structure (i.e., the cross-section taken along the x-z plane of the reference coordinate system x-y-z shown in FIGS. 3A-3H, e.g., the cross-section taken along a plane shown in FIG. 3A with a dashed line 320), while the bottom illustration shows a top-down view of the IC structure (i.e., the view of the x-y plane of the reference coordinate system).

A number of elements referred to in the description of FIGS. 3A-3H with reference numerals are illustrated in these figures with different patterns, with a legend showing the correspondence between the reference numerals and patterns being provided at the bottom of each drawing page containing FIGS. 3A-3H. For example, the legend illustrates that FIGS. 3A-3H use different patterns to show a support structure 322, a first electrically conductive material 324, a second electrically conductive material 330, etc. Furthermore, although a certain number of a given element may be illustrated in some of FIGS. 3A-3H (e.g., three bottom metal lines, two top metal lines, and one horizontal via between one of the bottom metal lines and one of the top metal lines), this is simply for ease of illustration, and more, or less, than that number may be included in an IC structure according to various embodiments of the present disclosure. Still further, various IC structure views shown in FIGS. 3A-3H are intended to show relative arrangements of various elements therein, and that various IC structures, or portions thereof, may include other elements or components that are not illustrated (e.g., transistor portions, various components that may be in electrical contact with any of the bottom metal line, the top metal line, and the horizontal via in between, etc.).

Turning to FIG. 2, the method 200 may begin with a process that includes providing, over a support structure, a plurality of bottom metal lines (e.g., the bottom metal lines 112 as shown in FIGS. 1A-1C) formed of a first electrically conductive material. To that end, various fabrication techniques may be used to provide the bottom metal lines. FIG. 2 illustrates a photolithographic subtractive fabrication technique as one example of a technique to provide the bottom metal lines, shown in processes 202-210 of the method 200, although in other embodiments of the method 200 other techniques may be used, such as single-Damascene or dual-Damascene techniques.

Figure 3A:
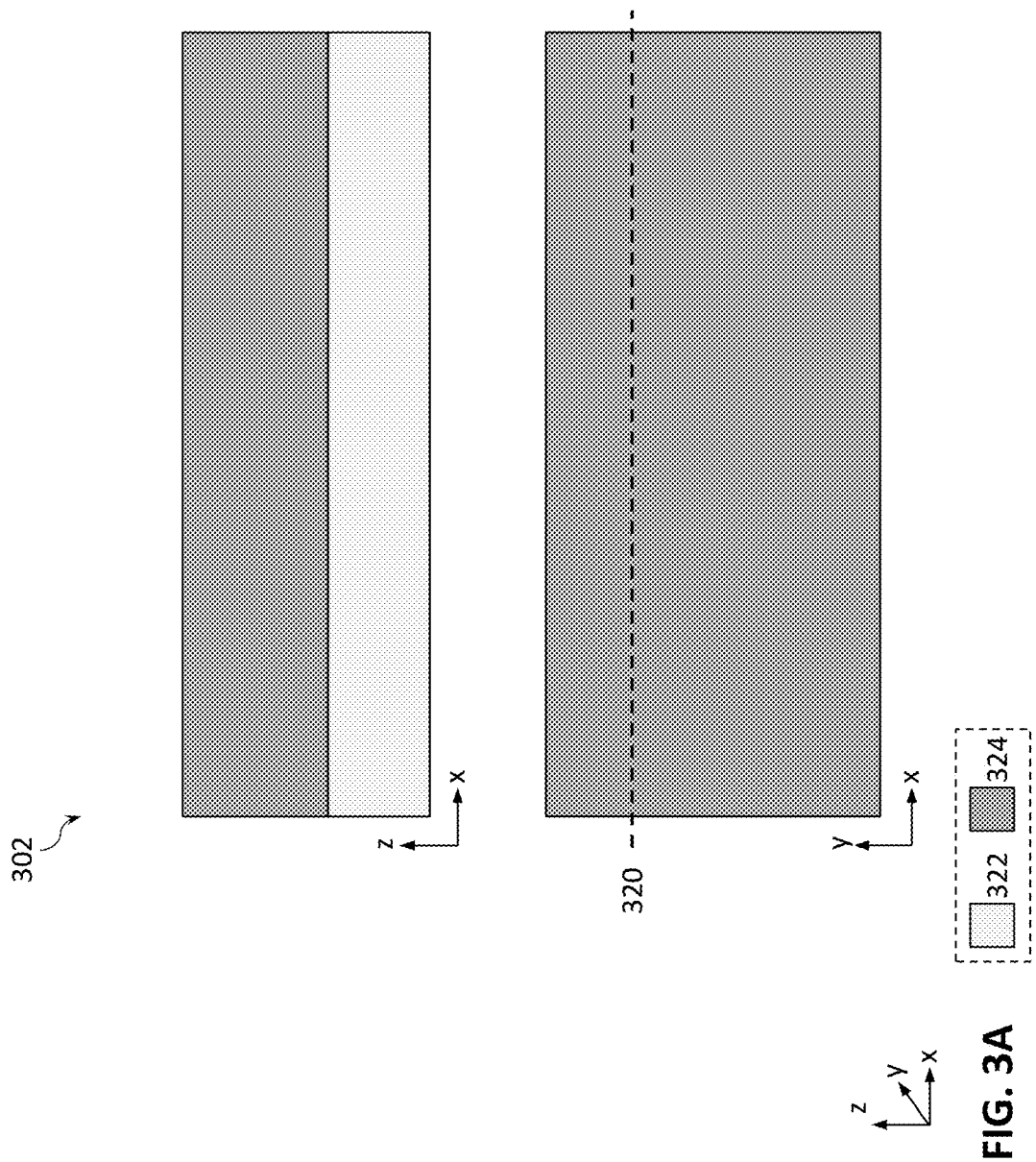
FIGS. 3A-3H illustrate cross-sectional side views and top-down views at various stages in the manufacture of an example integrated circuit (IC) structure according to the method of FIG. 2, in accordance with some embodiments.

Thus, fabrication of the plurality of bottom metal lines may begin with a process 202 that includes providing a layer of an electrically conductive material over a support structure. An IC structure 302, depicted in FIG. 3A, illustrates an example result of the process 202. As shown in FIG. 3A, the IC structure 302 may include a support structure 322 with a layer of an electrically conductive material 324 provided thereon.

In general, implementations of the disclosure may be formed or carried out on a substrate, such as a semiconductor substrate composed of semiconductor material systems including, for example, N-type or P-type materials systems. In one implementation, the semiconductor substrate may be a crystalline substrate formed using a bulk silicon or a silicon-on-insulator substructure. In other implementations, the semiconductor substrate may be formed using alternate materials, which may or may not be combined with silicon, that include but are not limited to germanium, indium antimonide, lead telluride, indium arsenide, indium phosphide, gallium arsenide, indium gallium arsenide, gallium antimonide, or other combinations of group III-V, group II-VI, or group IV materials. Although a few examples of materials from which the substrate may be formed are described here, any material that may serve as a foundation upon which an IC may be built falls within the spirit and scope of the present disclosure. In various embodiments, the support structure 322 may include any such substrate, possibly with some layers and/or devices already formed thereon, not specifically shown in the present figures, providing a suitable surface for forming the self-aligned staggered metal lines integrated in the BEOL thereon.

A layer of the first electrically conductive material 324 may be formed in the process 202 using a deposition technique such as, but not limited to, atomic layer deposition (ALD), chemical vapor deposition (CVD), plasma enhanced CVD (PECVD), physical vapor deposition (PVD) (e.g., evaporative deposition, magnetron sputtering, or e-beam deposition), or electroplating. In general, various electrically conductive materials described herein, e.g., the first electrically conductive material 324, may include one or more of any suitable electrically conductive materials (conductors). Such materials may include any suitable electrically conductive material, alloy, or a stack of multiple electrically conductive materials. In some embodiments, various electrically conductive materials described herein may include one or more metals or metal alloys, with metals such as copper, ruthenium, palladium, platinum, cobalt, nickel, hafnium, zirconium, titanium, tantalum, and aluminum. In some embodiments, various electrically conductive materials described herein may include one or more electrically conductive alloys, oxides (e.g., conductive metal oxides), carbides (e.g., hafnium carbide, zirconium carbide, titanium carbide, tantalum carbide, and aluminum carbide, tungsten, tungsten carbide), or nitrides (e.g. hafnium nitride, zirconium nitride, titanium nitride, tantalum nitride, and aluminum nitride) of one or more metals.

Figure 3B:
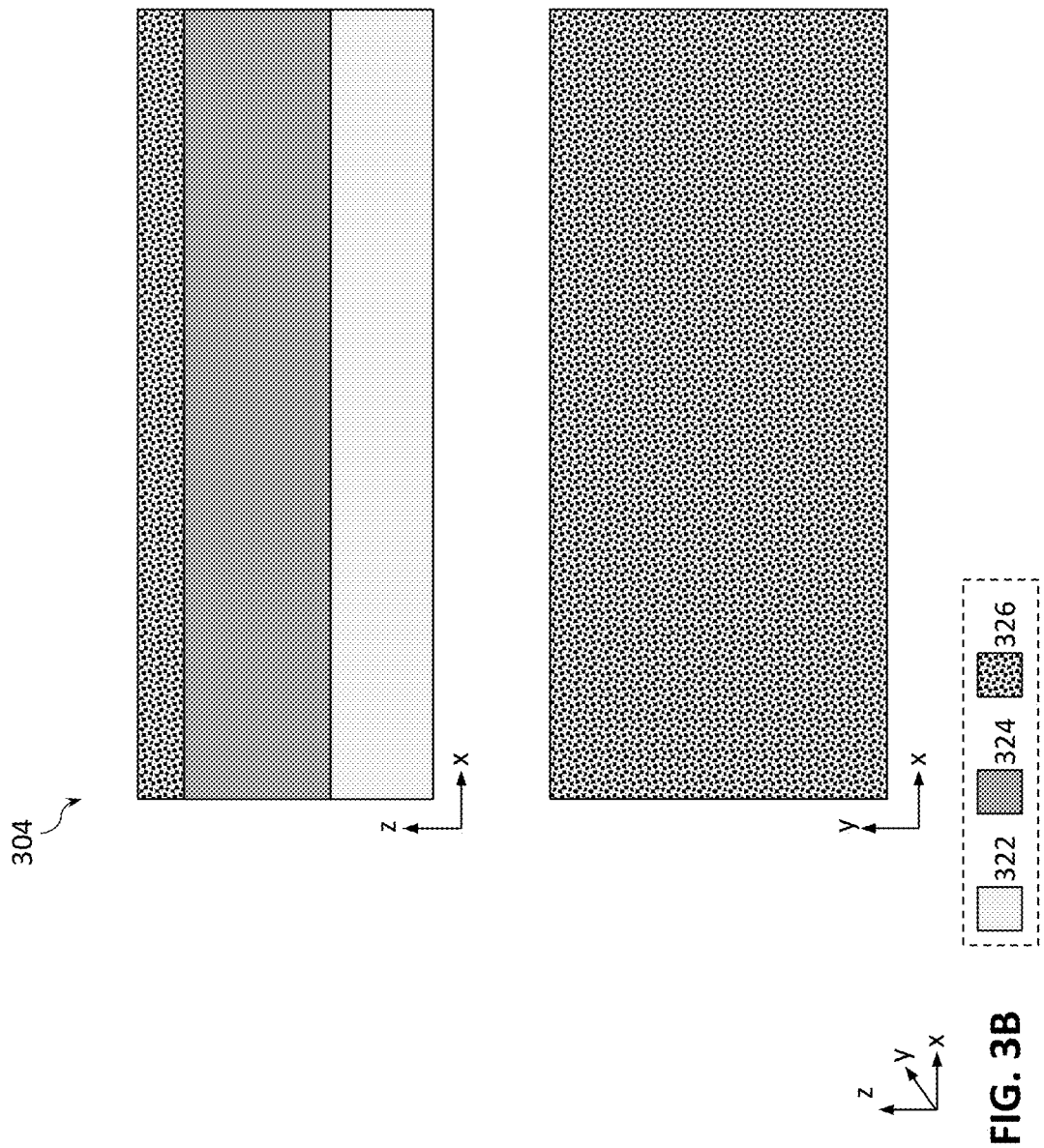

The fabrication of the plurality of bottom metal lines may then continue with a process 204 that includes providing a layer of a photoresist material over the layer of the first electrically conductive material over the support structure. An IC structure 304, depicted in FIG. 3B, illustrates an example result of the process 204. As shown in FIG. 3B, the IC structure 304 may include a layer of a photoresist material 326 provided over the electrically conductive material 324 provided in the process 202. In various embodiments, the photoresist material 326 may be provided in the process 204 using any suitable deposition technique such as, but not limited to, spin-coating, dip-coating, CVD, etc. Various materials that may be used as the photoresist material 326 are well-known in the art and, therefore, in the interests of brevity are not described herein detail.

Figure 3C:
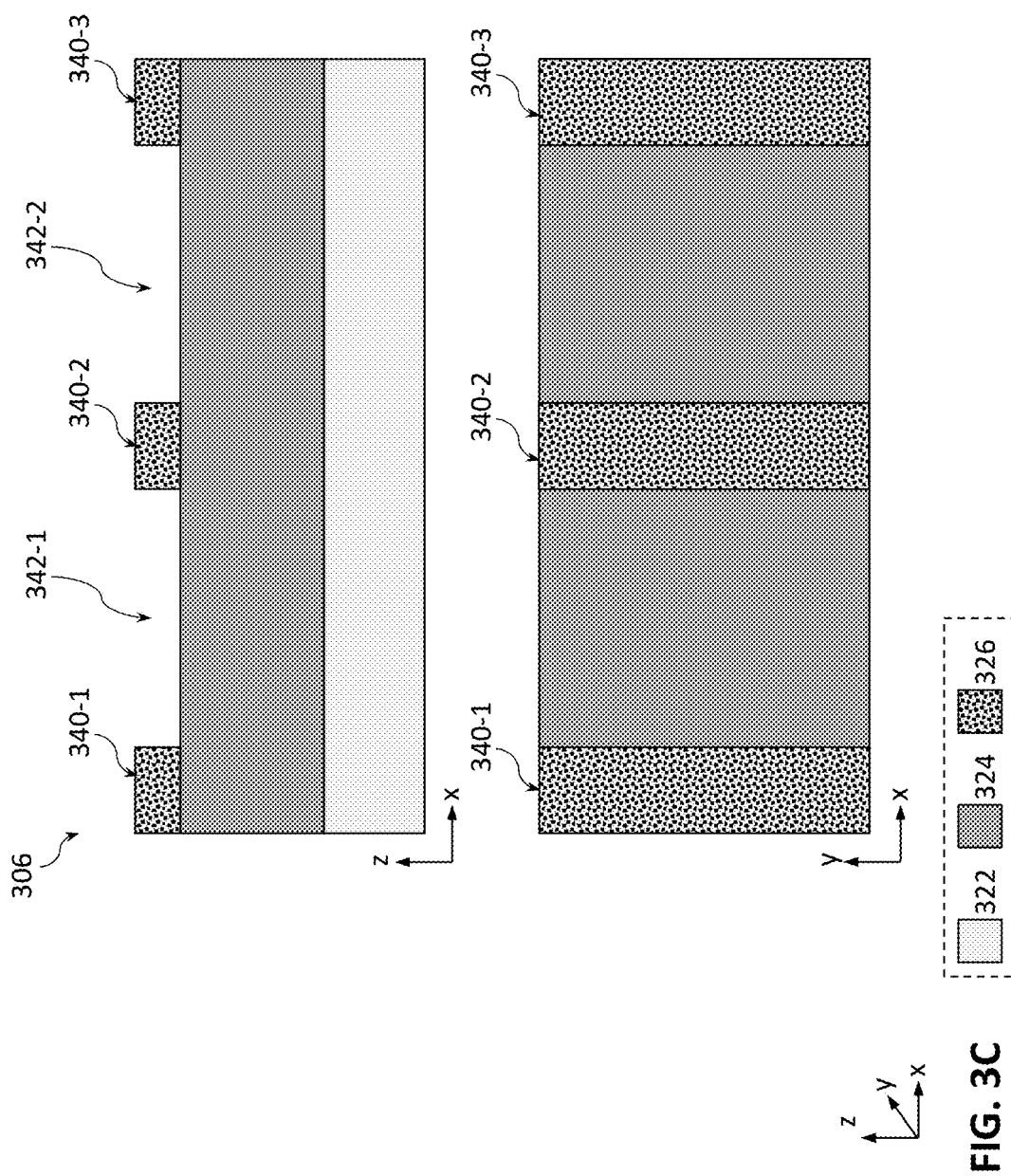

The fabrication of the plurality of bottom metal lines may then continue with a process 206 that includes patterning the layer of the photoresist material deposited in the process 204 to define locations and dimensions of the future bottom metal lines. An IC structure 306, depicted in FIG. 3C, illustrates an example result of the process 206. As shown in FIG. 3C, photoresist material 326 has been patterned, e.g., using photolithographic patterning as known in the art, to take shape of a plurality of photoresist lines 340 (shown in FIG. 3C with the example of 3 photoresist lines). An opening 342 is formed between each pair of adjacent photoresist lines 340 so that the first electrically conductive material 324 is exposed in the openings 342. For example, an opening 342-1 may be formed between the adjacent photoresist lines 340-1 and 340-2, and an opening 342-2 may be formed between the adjacent photoresist lines 340-2 and 340-3, as shown in FIG. 3C.

Figure 3D:
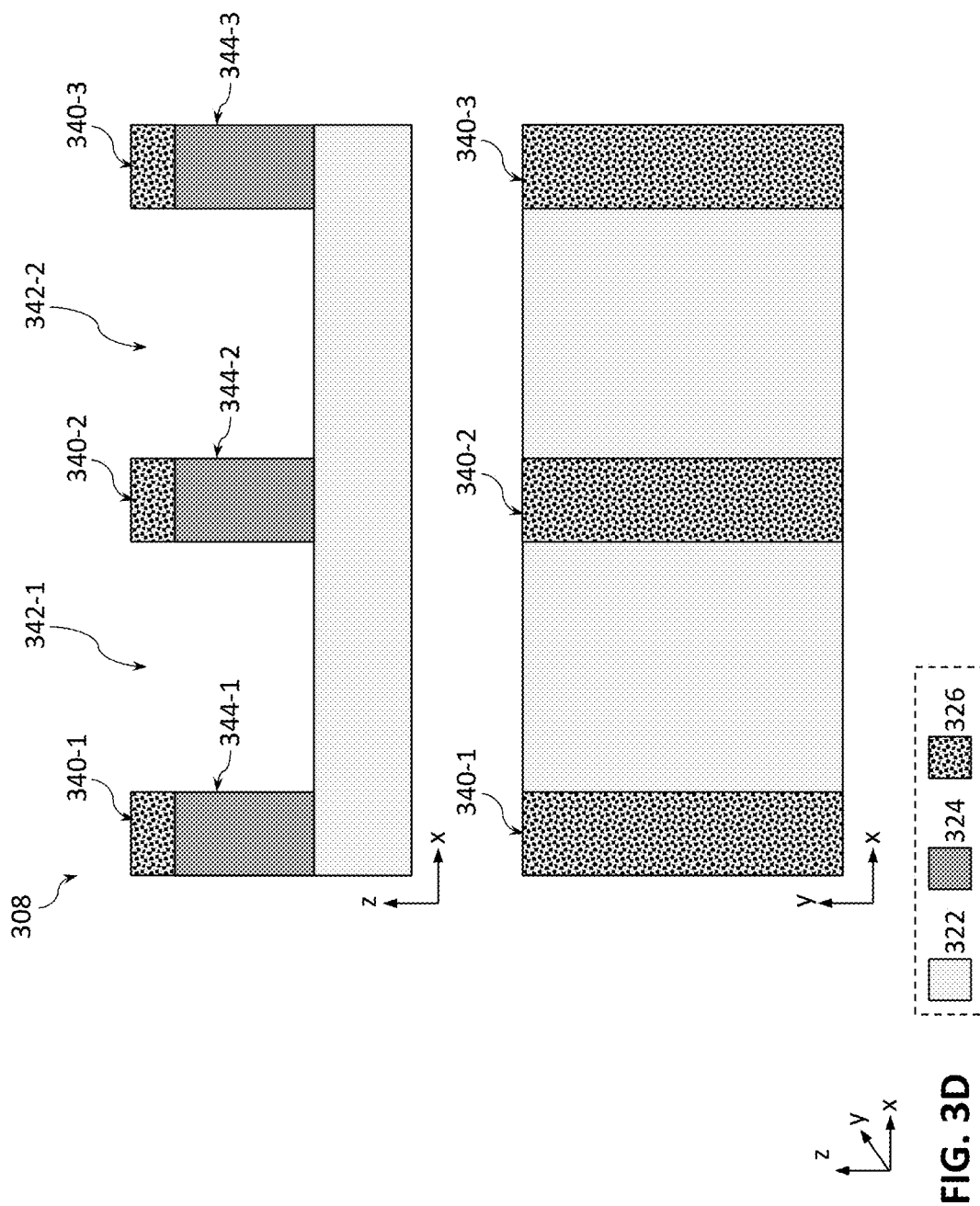

The method 200 may then proceed with a process 208 that includes etching the first electrically conductive material through the photoresist pattern formed in the process 206. An IC structure 308, depicted in FIG. 3D, illustrates an example result of the process 208. As shown in FIG. 3D, the first electrically conductive material 324 that has been exposed by the openings 342 is removed, so that the remainder of the first electrically conductive material 324 takes shape of metal lines 344, substantially the same as the shape of the photoresist lines 340. Any suitable etching technique, e.g., a dry etch, such as e.g., radio frequency (RF) reactive ion etch (RIE) or inductively coupled plasma (ICP) RIE, may be used in the process 208. In some embodiments, the etch performed in the process 208 may include an anisotropic etch, using etchants in a form of e.g., chemically active ionized gas (i.e., plasma) using e.g., bromine (Br) and chloride (Cl) based chemistries. In some embodiments, during the etch of the process 208, the IC structure may be heated to elevated temperatures, e.g., to temperatures between about room temperature and 200 degrees Celsius, including all values and ranges therein, to promote that byproducts of the etch are made sufficiently volatile to be removed from the surface.

Figure 3E:
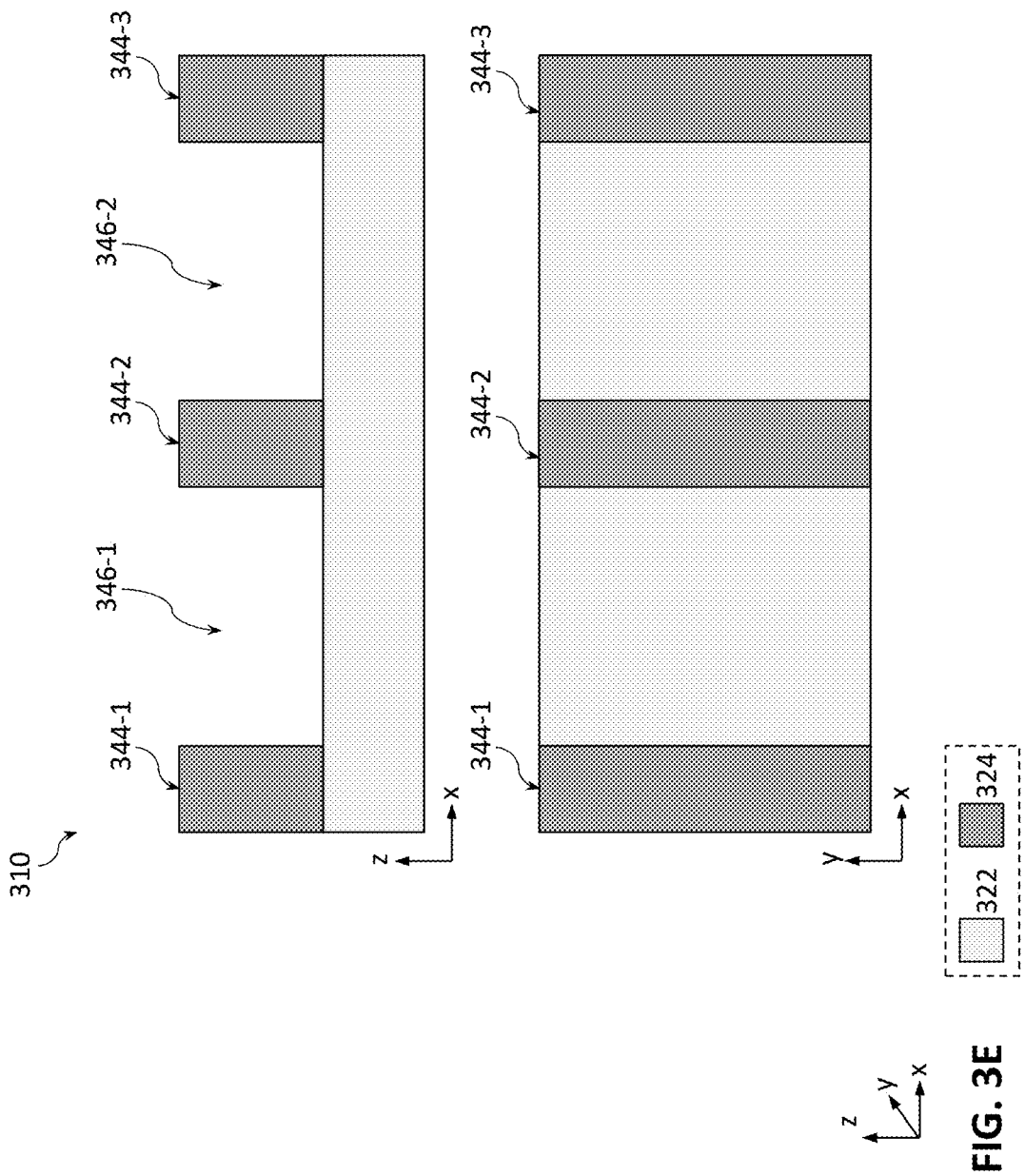

Next, the remainder of the photoresist may be removed in a process 210 that includes patterning the layer of the photoresist material deposited in the process 204 to define locations and dimensions of the future bottom metal lines. An IC structure 310, depicted in FIG. 3E, illustrates an example result of the process 210. As shown in FIG. 3E, the remaining photoresist material 326 has been removed, leaving a plurality of metal lines 344, which are the bottom metal lines of the future metallization stack. An opening 346 is formed between each pair of the adjacent bottom metal lines 344 so that the support structure 322 is exposed in the openings 346. For example, an opening 346-1 may be formed between the adjacent bottom metal lines 344-1 and 344-2, and an opening 346-2 may be formed between the adjacent bottom metal lines 344-2 and 344-3, as shown in FIG. 3E. In some embodiments, the remaining photoresist material may be removed in the process 210 using an ashing technique, where the photoresist material 326 is exposed to oxygen or fluorine, which combines with the photoresist to form ash that can be easily removed.

In general, fabrication of the bottom metal lines 344 may be performed any suitable patterning techniques, such as, but not limited to, photolithographic or electron-beam (e-beam) patterning, possibly in conjunction with a suitable etching technique, e.g., a dry/anisotropic etch.

Figure 3F:
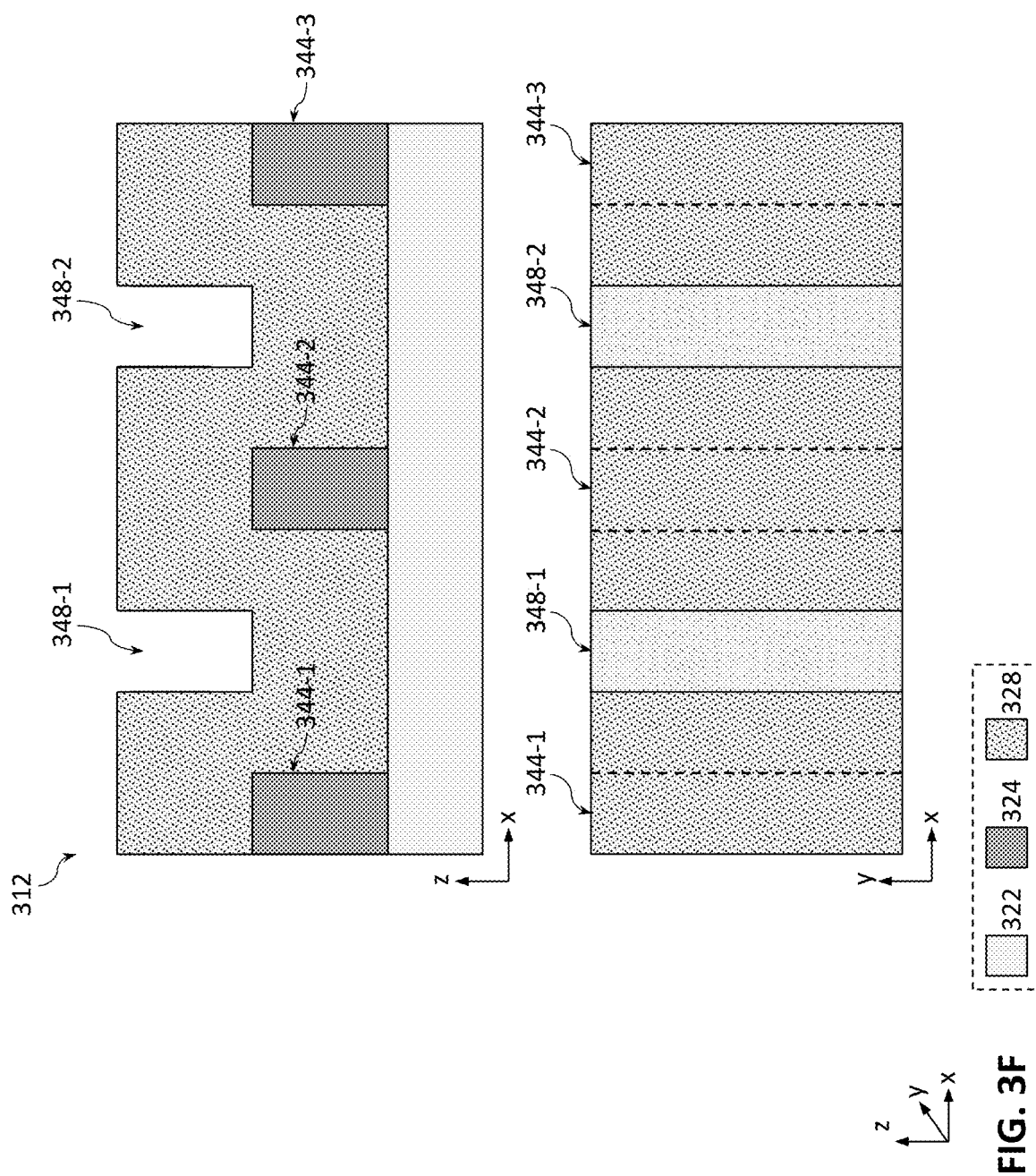

The method 200 may then continue with a process 212 that includes performing conformal deposition of a layer of a spacer material over the bottom metal lines formed over the support structure. An IC structure 312, depicted in FIG. 3F, illustrates an example result of the process 212. As shown in FIG. 3F, the IC structure 312 includes a spacer material 328, deposited conformal to the bottom metal lines 344. The spacer material 328 may include any suitable insulator material. Examples of insulator materials that may be used as the spacer material 328 may include, but are not limited to, silicon dioxide (SiO$_2$), carbon-doped oxide (CDO), silicon nitride, fluorosilicate glass (FSG), and organosilicates such as silsesquioxane, siloxane, or organosilicate glass. In some embodiments, the spacer material 328 may include organic polymers such as polyimide, polynorbornenes, benzocyclobutene, perfluorocyclobutane, or polytetrafluoroethylene (PTFE). Still other examples of low-k dielectric materials that may be used as the spacer material 328 include silicon-based polymeric dielectrics such as hydrogen silsesquioxane (HSQ) and methylsilsesquioxane (MSQ). Any suitable conformal deposition process, such as ALD or CVD, may be used to deposit the spacer material 328 over and in between the bottom metal lines 344. Because the process 212 includes conformal deposition, where the spacer material 328 is deposited over all exposed surfaces in a way that the shape of the spacer material 328 follows the shape of the underlying surfaces, openings 348 will be formed in the spacer material 328, corresponding to the openings 346 that were formed between each pair of the adjacent bottom metal lines 344. For example, an opening 348-1 may be formed between and above the adjacent bottom metal lines 344-1 and 344-2, and an opening 348-2 may be formed between and above the adjacent bottom metal lines 344-2 and 344-3, as shown in FIG. 3F. Considerations with respect to the deposition process 212 will be described in greater detail below.

Figure 3G:
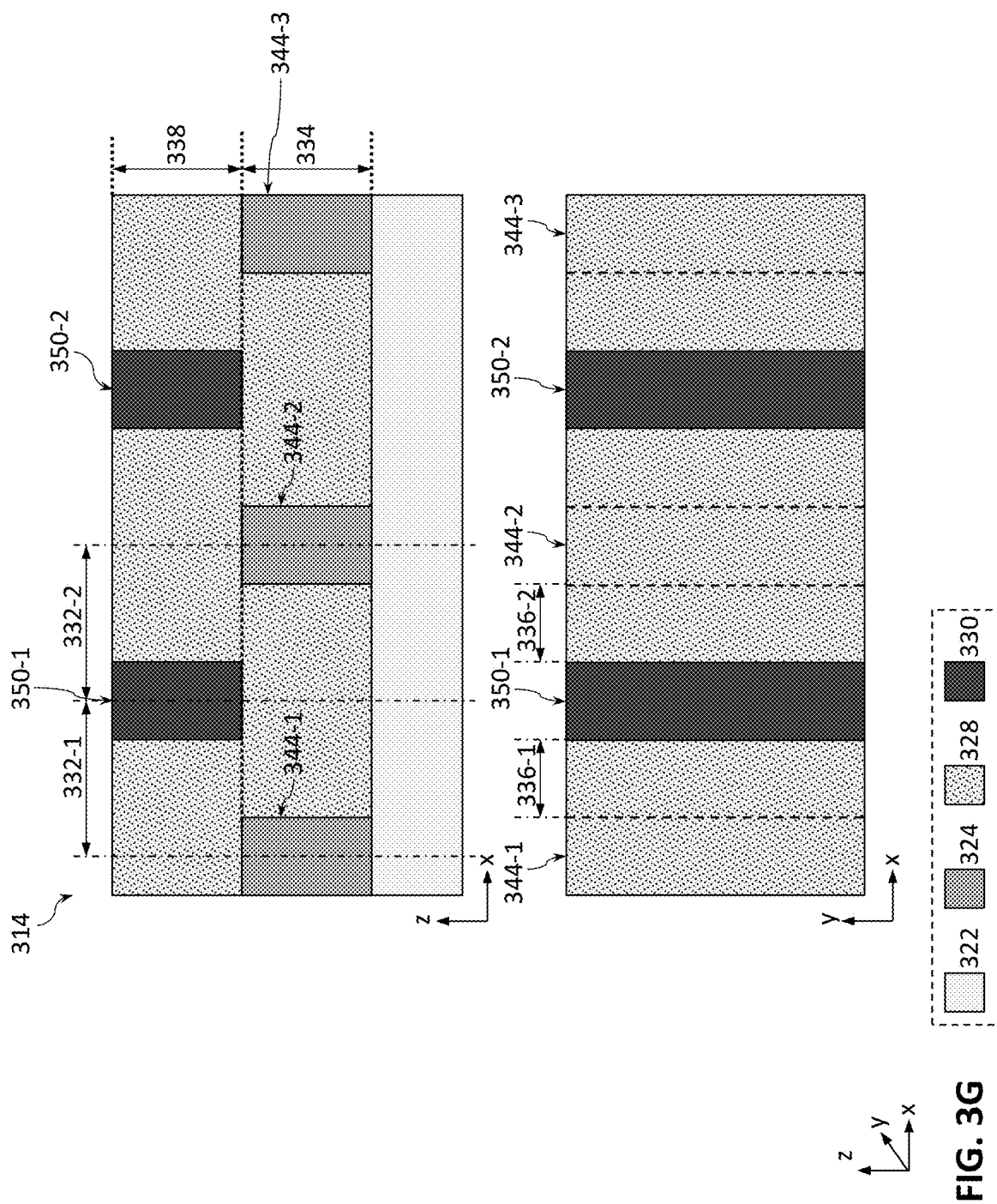

The method 200 may further include a process 214, in which the openings formed by the conformal deposition of the spacer material in the process 212 are at least partially filled with a second electrically conductive material. An IC structure 314, depicted in FIG. 3G, illustrates an example result of the process 214. As shown in FIG. 3G, a second electrically conductive material 330 may be deposited into the openings 348 formed in the process 212. The openings 348 filled with the second electrically conductive material 330 form top metal lines 350. For example, a top metal line 350-1 may be formed by filling the opening 348-1 with the second electrically conductive material 330, and a top metal line 350-2 may be formed by filling the opening 348-2 with the second electrically conductive material 330, as shown in FIG. 3G. The second electrically conductive material 330 may include any of the materials described with reference to the first electrically conductive material 324 and may be deposited using any of the techniques described with reference to the first electrically conductive material 324. In some embodiments of the process 214, an overburden of the second electrically conductive material 330 (i.e., portions of the second electrically conductive material 330 that may be deposited over the surfaces of the spacer material 328 outside of the openings 348) may be removed, e.g., using CMP or any other polishing process, to expose the spacer material 328 between the openings 348 filled with the second electrically conductive material 330, as is illustrated in FIG. 3G. In some embodiments, the first and second electrically conductive materials 324 and 330 may have substantially the same material composition. However, in other embodiments, the first and second electrically conductive materials 324 and 330 may include different electrically conductive materials, which would then be clearly distinguishable in an image of the IC structure 314 using a suitable characterization equipment, such as TEM or SEM. Using different materials for the first and second electrically conductive materials 324 and 330 may be particularly advantageous when one of these materials is used in a subtractive fabrication technique (as was described above with reference to the first electrically conductive material 324 being used to form the bottom metal lines 344), while another one of these materials is used in a Damascene fabrication technique (as was described above with reference to the second electrically conductive material 330 being used to form the top metal lines 350).

Some of the processes of the fabrication method 200 may leave characteristic features in the final IC structures, indicative of the method 200 being used. For example, some such characteristic features are associated with the use of the spacer material 328 in the manner described herein. In particular, FIG. 3G illustrates the importance of the openings 348 formed in the process 212, since these openings act as a foundation for forming the top metal lines 350. Because the process 212 is a conformal deposition process, the top metal lines 350 will naturally be self-aligned with respect to the bottom metal lined 344. This can be seen in FIG. 3G with each top metal line 350 being equidistant to each of the pair of the nearest bottom metal lines 344 between the tom metal line 350 is provided. For example, as shown in FIG. 3G, a center-to-center distance 332-1 between the center of the top metal line 350-1 and the bottom metal line 344-1 may be substantially the same as a center-to-center distance 332-2 between the center of the top metal line 350-1 and the bottom metal line 344-2. In FIG. 3G, the dashed and dot-dashed lines illustrate planes that extend in a direction parallel to the long axis of the metal lines 344, 350 and are substantially perpendicular to the support structure 322, while the dotted lines illustrate planes that extend in a direction parallel to the long axis of the metal lines 344, 350 and are substantially parallel to the support structure 322. The dot-dashed lines between which the distances 332 are measured may illustrate planes of symmetry for the respective metal lines in the center of which each of these lines is shown. Because the distances 332-1 and 332-2 are substantially the same, the top metal line 350-1 is self-aligned in between the pair of the bottom metal lines 344-1 and 344-2. The same applies to the top metal line 350-2 being self-aligned in between the pair of the bottom metal lines 344-2 and 344-3.

As shown in FIG. 3G, the bottom metal lines 344 may have a height 334 (a dimension measured along the z-axis of the example coordinate system shown). Careful design of the parameters of the deposition process 212 may include ensuring that the spacer material 328 is deposited in such a manner that the openings 348 are formed in a plane just above, or aligned with, the upper faces of the bottom metal lines 344. This means that, in some embodiments, the spacer material 328 may be deposited in the process 212 until its' thickness along the horizontal surfaces (i.e., a dimension measured along the z-axis of the example coordinate system shown) may be substantially equal to the height 334. In such a case, an upper face of each of the bottom metal lines 344 and a lower face of the top metal lines 350 may be substantially in a single plane that is substantially parallel to the support structure 332 (said plane depicted in FIG. 3G as the dotted line between the measurements of heights 334 and 338). However, in other embodiments, the lower face of the top metal lines 350 may be closer to the support structure 322 than the upper faces of the bottom metal lines 344. While this may result in a slight increase in capacitance, it may still be worthwhile as it may allow making the top metal lines 350 taller, thereby lowering resistance when a horizontal via makes a contact to a sidewall of one of them. In still other embodiments, the lower face of the top metal lines 350 may be farther away from the support structure 322 than the upper faces of the bottom metal lines 344.

As shown in FIG. 3G, the top metal lines 350 may have a height 338 (a dimension measured along the z-axis of the example coordinate system shown). In some embodiments, the height 338 may be substantially equal to or smaller than the height 334. In some embodiments, the height 338 and the height 334 may be the same by controlling the deposition process 212 to make sure that the thicknesses of the spacer 328 deposited over different horizontal surfaces (e.g. over horizontal surfaces at the bottom of the openings 346 vs horizontal surfaces at the top of the bottom metal lines 344, shown in FIG. 3E) are substantially the same. However, in other embodiments, the upper surfaces of the spacer 328 and/or of the top metal lines 350 may subsequently be polished to reduce the height 338, leading to the height 338 being smaller than the height 334 in some embodiments.

In various embodiments, a distance 336-1 between a projection of the top metal line 350-1 onto a plane parallel to the support structure 322 and a similar projection of the bottom metal line 344-1 may be substantially equal to or smaller than the height 334 of the bottom metal lines 344. In some embodiments, the distance 336-1 and the height 334 may be the same due to the conformal deposition of the spacer material 328 where a thickness of the spacer 328 is substantially the same on the substantially horizontal and substantially vertical surfaces over which the spacer material 328 is deposited. However, in other embodiments, the distance 336-1 may be smaller than the height 334 by changing one or more deposition parameters of the conformal deposition process for the deposition of the spacer material 328 to be such that the thickness of the spacer material 328 deposited over the substantially vertical surfaces (e.g., over the sidewalls of the bottom metal lines 344) is smaller than the thickness of the spacer material 328 deposited over the substantially horizontal surfaces (e.g., over the surfaces in between the bottom metal lines 344 and over the upper faces of the bottom metal lines 344). The same applies to a distance 336-2 between the projection of the top metal line 350-1 onto the plane parallel to the support structure 322 and a similar projection of the bottom metal line 344-2, as well as to the analogous distances between the projections of the top metal line 350-2 and the projections of each of the bottom metal line 344-2 and 344-3.

Another characteristic feature are associated with the use of the spacer material 328 in the manner described herein is that the final IC structures, e.g., the IC structures 314 or 316, may include the spacer material 328 that is a continuous layer of spacer material surrounding and being in contact with each of the bottom metal lines 344 and the top metal lines 350. The use of a continuous layer of the spacer material 328 in different layers of a metallization stack may be detected in images of the IC structure using suitable characterization equipment, such as TEM, electron energy loss spectroscopy (EELS), or energy dispersive X-ray (EDS).

Figure 3H:
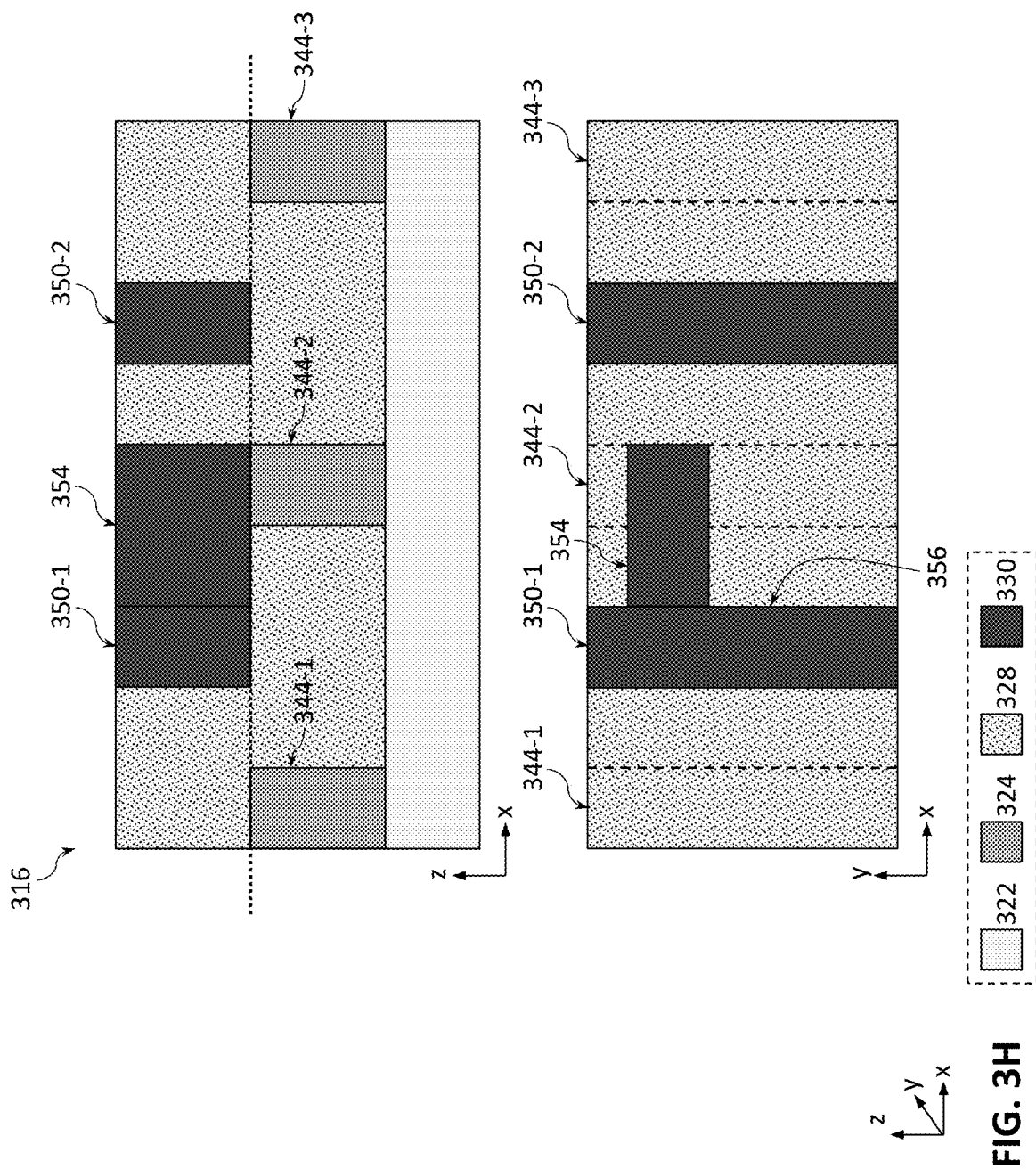

Turning back to FIG. 2, optionally, the method 200 may also include a process 216 in which one or more horizontal vias, as well as one or more regular, vertical, vias may be provided to enable electrical connectivity between different bottom and top metal lines formed in the previous processes. An IC structure 316, depicted in FIG. 3H, illustrates an example result of the process 216. As shown in FIG. 3H, the IC structure 316 includes a horizontal via 354, coupled to an upper face of the bottom metal line 344-2 and to a sidewall 356 of the top metal line 350-1. Drawings analogies between the illustrations of FIGS. 1A-1C and the illustrations of FIGS. 3A-3H which show how the method 200 may be used to form the metallization stack 100 as shown in FIGS. 1A-1C, in some embodiments, the horizontal via 354 may be analogous to the horizontal via 124, the top metal line 350-1 may be analogous to the top metal line 122-1, while the bottom metal line 344-2 may be analogous to the bottom metal line 112-1. Similarly, the top metal line 350-2 may be analogous to the top metal line 122-2, and the bottom metal line 344-3 may be analogous to the bottom metal line 112-2.

In some embodiments, the horizontal via 354 may be provided using any suitable fabrication process. In some embodiments, the horizontal via 354 may include substantially the same electrically conductive material as that of the top metal lines 350, which material may be deposited in a single process to form both the top metal lines 350 and the horizontal via 354 (provided a suitable opening for the horizontal via 354 has been patterned in the spacer material 328). That is illustrated in FIG. 3H with the same second electrically conductive material 330 used to illustrate the top metal lines 350 and the horizontal via 354. Of course, in other embodiments, the material compositions of the electrically conductive materials used to form the top metal lines 350 and the horizontal via 354 may be different.

In some embodiments, an upper face of the horizontal via 354 and an upper face of the top metal line to which the horizontal via 354 is electrically coupled to may be in a single second plane that is substantially parallel to the support structure. Thus, the top of the horizontal via 354 may be aligned with the top of the top metal line 350-1, as shown in FIG. 3H.

In some embodiments, the lower face of the horizontal via 354 and the lower face of the top metal line to which the horizontal via 354 is coupled to may be in a single plane that is substantially parallel to the support structure 322. Thus, the bottom of the horizontal via 354 may be aligned with the bottom of the top metal line 350-1, as is shown for the embodiment of FIG. 3H where said plane of lower face alignment it the plane illustrated with a dotted line in the cross-sectional side view. In some embodiments, the bottom of the horizontal via 354 may be coupled to the upper face of the one of the bottom metal lines to which the horizontal via 354 is electrically coupled to, e.g., of the bottom metal line 344-2.

FIGS. 3A-3H illustrate some example IC structures that may be fabricated to include a metallization stack with one or more self-aligned staggered metal lines as described herein. Some further examples, each of which could have been illustrated in illustrations of various stages of fabrication according to the method 200 similar to FIGS. 3A-3H, are shown in FIGS. 4A-4D, in accordance with some embodiments.

Figure 4A:
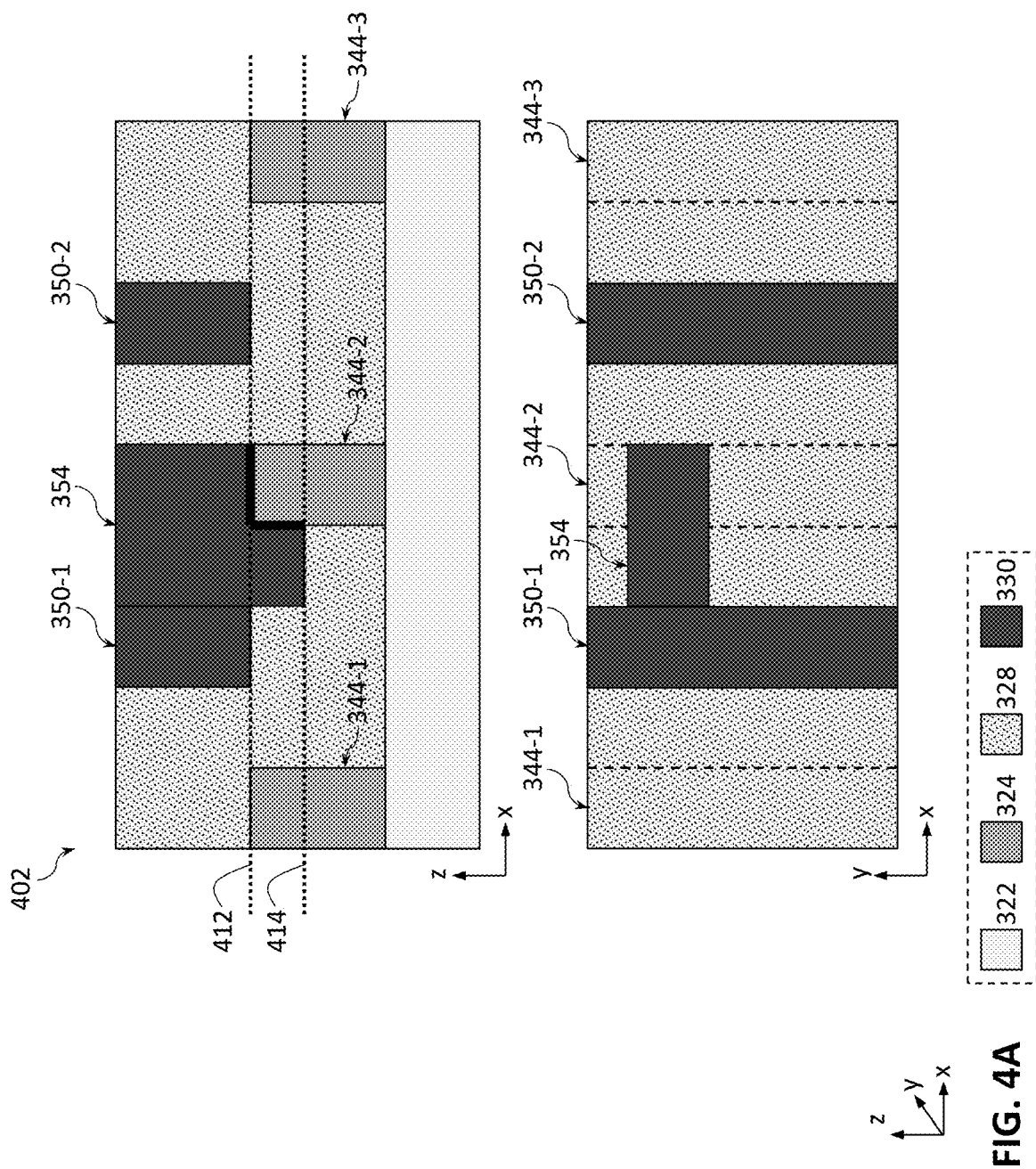
FIGS. 4A-4D provide different further examples of an example metallization stack with self-aligned staggered metal lines, in accordance with some embodiments.

For example, while FIG. 3H illustrated that the bottom of the horizontal via 354 may be aligned with the top of the bottom metal line 344-2, FIG. 4A illustrates an IC structure 402 which is substantially the same as the IC structure 316 shown in FIG. 3H (which descriptions, therefore, in the interests of brevity, are not repeated here) except that the bottom of the horizontal via 354 extends further towards the support structure 322 than (i.e., is not aligned with) the top of the bottom metal line 344-2 to which the horizontal via 354 is coupled to. In particular, as is shown in FIG. 4A, the top of the bottom metal line 344-2 may be in a plane 412, while the bottom of the horizontal via 354 may be in a plane 414, which is closer to the support structure 322 than the plane 412. Thus, in some embodiments, the lower face of the horizontal via 354 may be closer to the support structure 322 than the upper face of the bottom metal line to which the horizontal via 354 is coupled to. Such embodiments may be advantageous in terms of the decreased resistance associated with the horizontal via 354 because the area of overlap between the horizontal via 354 and the bottom metal line 344-2 is increased. In the embodiment of FIG. 3H, the horizontal via 354 may be aligned with the top of the bottom metal line 344-2, meaning that the horizontal via 354 and the bottom metal line 344-2 overlap only at an area along the upper face of the bottom metal line 344-2 (i.e., along the plane 412 shown in FIG. 4A, where the same plane is illustrated in FIG. 3H with a dotted line). On the other hand, in the embodiment of FIG. 4A, the horizontal via 354 may overlap with the top of the bottom metal line 344-2 in the plane 412 as in the embodiment of FIG. 3H, and may also overlap in a plane substantially perpendicular to the plane 412, along a portion of the sidewall of the bottom metal line 344-2, between the planes 414 and 412. Areas of overlap between the horizontal via 354 and the bottom metal line 344-2 are illustrated in the cross-sectional view of FIG. 4A as thick black lines where the horizontal via 354 and the bottom metal line 344-2 interface one another. In some embodiments, a portion of the horizontal via 354 may at least partially wrap around an upper portion of the bottom metal line 344-2, which would also result in an increased overlap between the horizontal via 354 and the bottom metal line 344-2. Embodiments where an overlap between the horizontal via 354 and the bottom metal line 344-2 is increased may be particularly beneficial for implementations where the metal lines, in particular the bottom metal lines 344 are such that their width (i.e., a dimension measured along the x-axis of the example coordinate system shown in the present drawings) are smaller than their heights (i.e., a dimension measured along the z-axis of the example coordinate system shown in the present drawings).

Figure 4B:
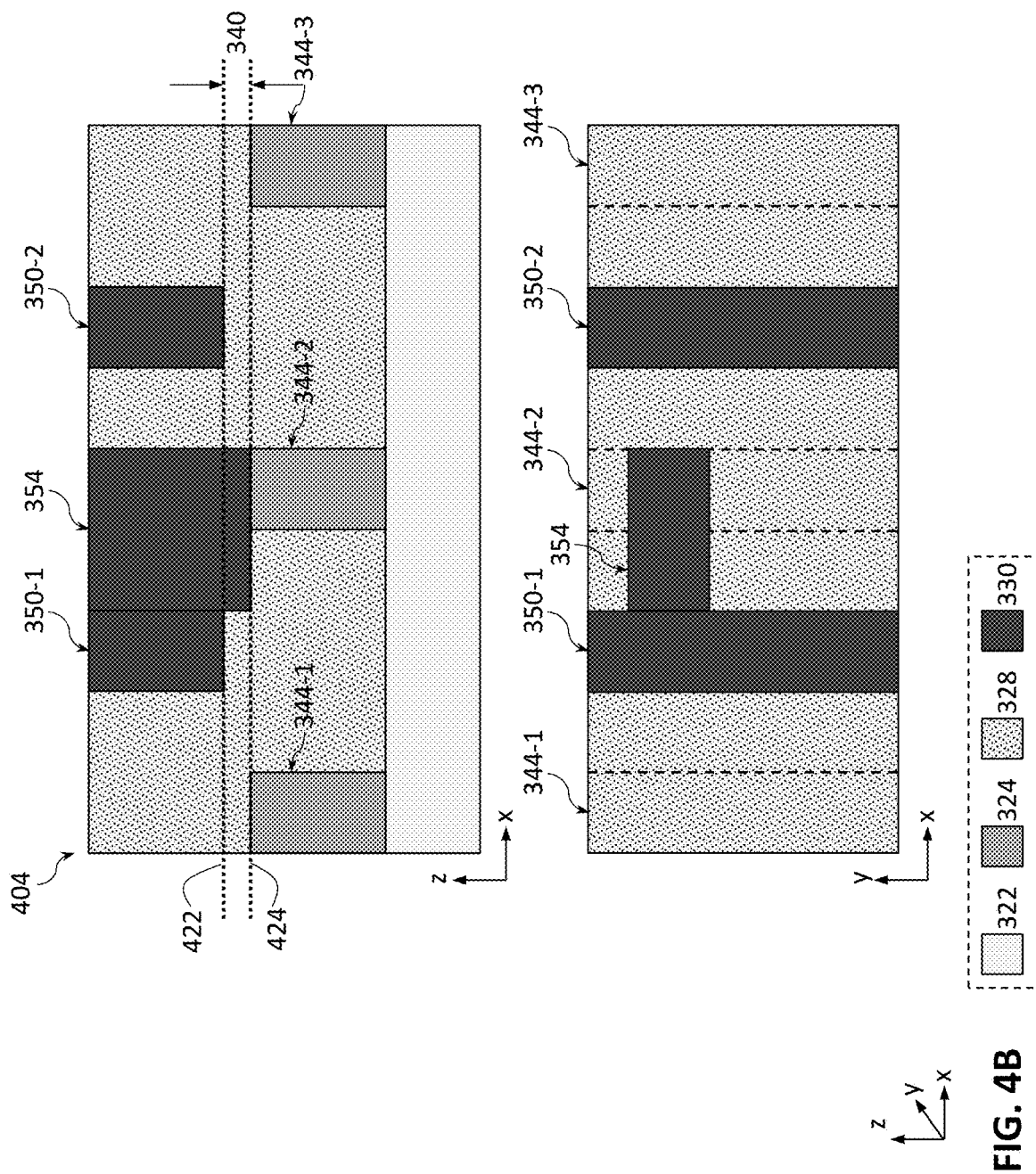

In another example, while FIG. 3H illustrated that the bottom of the horizontal via 354 may be aligned with the bottom of the top metal line 350-1, FIG. 4B illustrates an IC structure 404 which is substantially the same as the IC structure 316 shown in FIG. 3H (which descriptions, therefore, in the interests of brevity, are not repeated here), except that the bottom of the horizontal via 354 extends further towards the support structure 322 than (i.e., is not aligned with) the bottom of the top metal line 350-1 to which the horizontal via 354 is coupled to. In particular, as is shown in FIG. 4B, the bottom of the top metal line 350-1 may be in a plane 422, while the bottom of the horizontal via 354 may be in a plane 424, which is closer to the support structure 322 than the plane 422. Thus, in some embodiments, the lower face of the horizontal via 354 may be closer to the support structure 322 than the lower face of the top metal line to which the horizontal via 354 is coupled to. Although not specifically shown in the present drawings, in some embodiments, an IC structure may include both the feature described with reference to FIG. 4A and the feature described with reference to FIG. 4B. In other words, in further embodiments of the IC structure 404 of FIG. 4B, the bottom of the horizontal via 354 may extend further towards the support structure 322 than the top of the bottom metal line 344-2 to which the horizontal via 354 is coupled to, so that the area of the overlap of the horizontal via 354 and the bottom metal line 344-2 may be increased, as was described with reference to FIG. 4A.

Figure 4C:
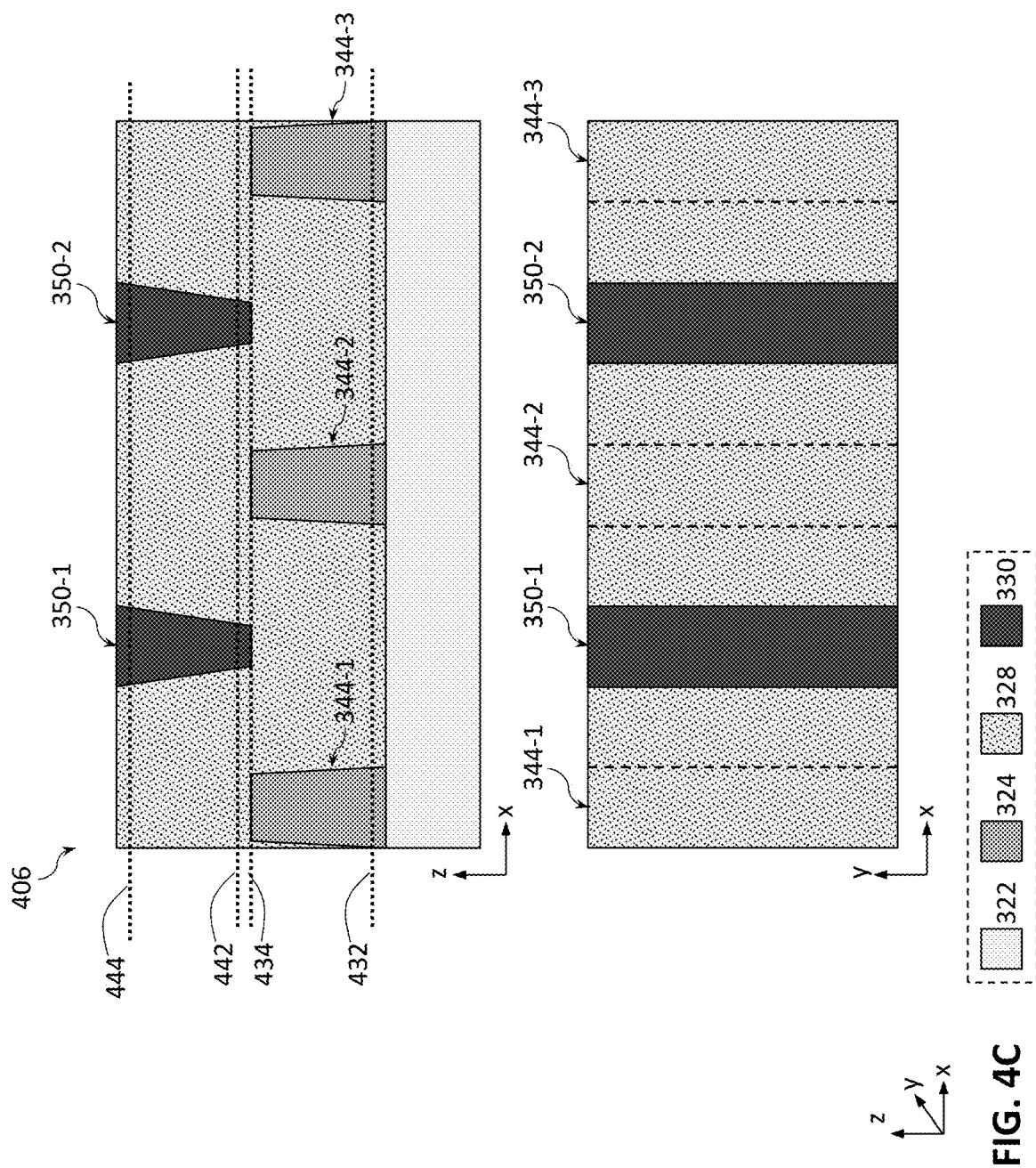
Figure 4D:
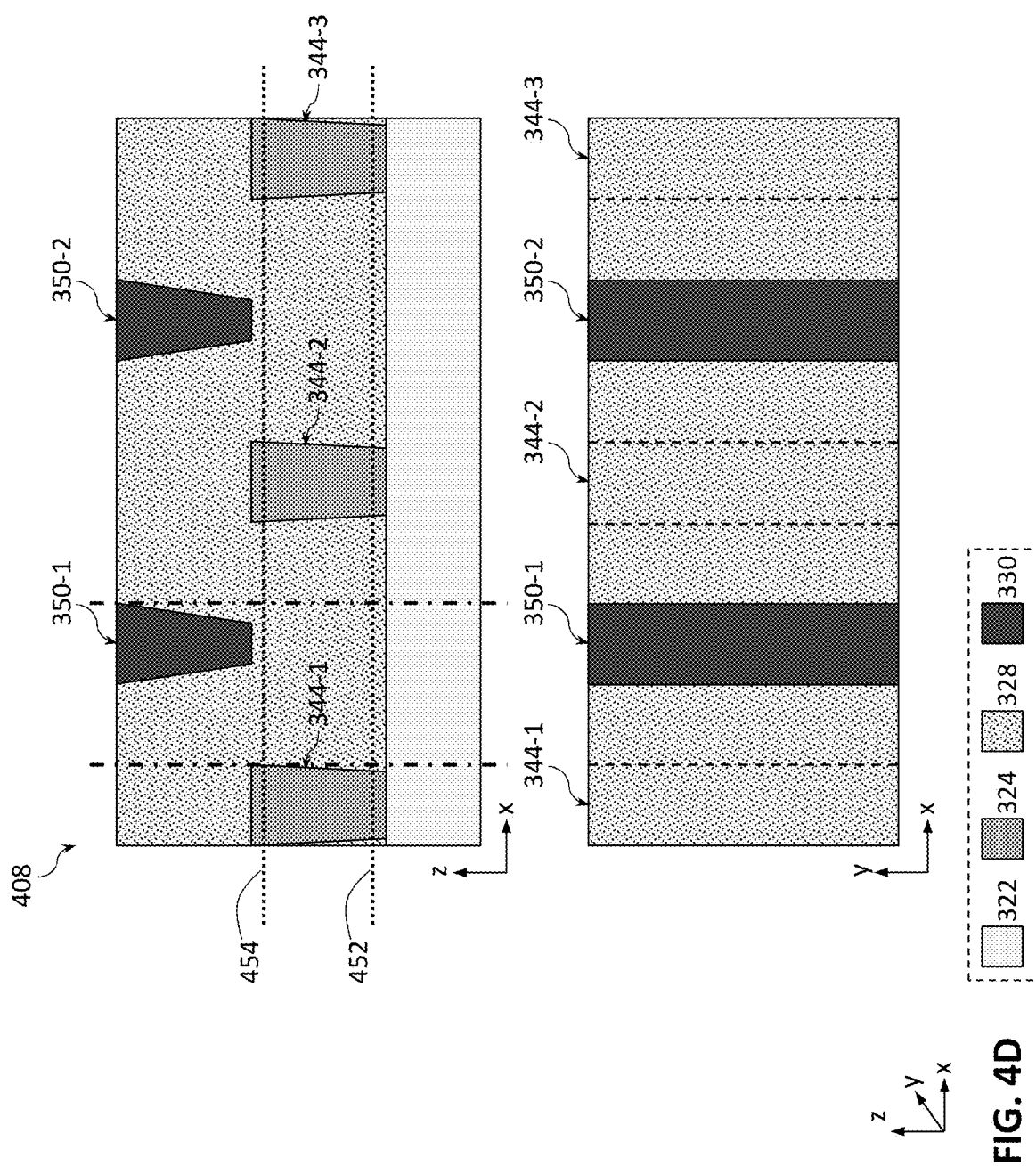

It was described above, the use of at least some processes of the fabrication method 200 leaves several characteristic features in the final IC structures that are indicative of the method 200 being used. FIGS. 4C and 4D illustrate examples of such characteristic features being the shapes of the bottom and top metal lines. While FIG. 3G illustrated the cross-sections of various metal lines as being substantially rectangular, FIG. 4C illustrates an IC structure 406 and FIG. 4D illustrates an IC structure 408, each of which is substantially the same as the IC structure 314 shown in FIG. 3G (which descriptions, therefore, in the interests of brevity, are not repeated here), except that the cross-sections of various metal lines as being substantially trapezoidal.

As is shown in FIG. 4C, in some embodiments, a width of at least some of the bottom metal lines 344 in a first plane 432 that is substantially parallel to the support structure 322 may be greater than a width of those bottom metal lines 344 in a second plane 434 that is substantially parallel to the support structure 322, where the first plane 432 is between the support structure 322 and the second plane 434 (e.g., the first plane 432 may be closer to, or at, the bottom of the bottom metal lines 344 and the second plane 434 may be closer to, or at, the top of the bottom metal lines 344). Trapezoidal shapes of the cross-sectional side view of the bottom metal lines 344 with the tops being narrower than the bottoms may be indicative of the subtractive method that may be used to fabricate them, e.g., the method described in the processes 202-210 of the method 200.

As is also shown in FIG. 4C, in some embodiments, a width of at least some of the top metal lines 350 in a first plane 442 that is substantially parallel to the support structure 322 may be smaller than a width of those top metal lines 350 in a second plane 444 that is substantially parallel to the support structure 322, where the first plane 442 is between the support structure 322 and the second plane 444 (e.g., the first plane 442 may be closer to, or at, the bottom of the top metal lines 350 and the second plane 444 may be closer to, or at, the top of the top metal lines 350). Trapezoidal shapes of the cross-sectional side view of the top metal lines 350 with the bottoms being narrower than the tops may be indicative of the Damascene method that may be used to fabricate them.

As was described above, the bottom metal lines 344 may be fabricated using a Damascene fabrication as well. An example illustration of this is shown in FIG. 4D, showing that, in some embodiments, a width of at least some of the bottom metal lines 344 in a first plane 452 that is substantially parallel to the support structure 322 may be smaller than a width of those bottom metal lines 344 in a second plane 454 that is substantially parallel to the support structure 322, where the first plane 452 is between the support structure 322 and the second plane 454 (e.g., the first plane 452 may be closer to, or at, the bottom of the bottom metal lines 344 and the second plane 454 may be closer to, or at, the top of the bottom metal lines 344). Trapezoidal shapes of the cross-sectional side view of the bottom metal lines 344 with the tops being wider than the bottoms may be indicative of the Damascene method that may be used to fabricate them, e.g., when the method described in the processes 202-210 of the method 200 is replaced by a Damascene method for providing the bottom metal lines 344. FIG. 4D illustrates the top metal lines 350 having the trapezoidal shapes as described with reference to FIG. 4C.

In some further embodiments, where both the bottom metal lines 344 and the top metal lines 350 are fabricated using a Damascene process, the use of the spacer material 328 as described in the fabrication method 200 may still be detectable in the final structures in that the angles of the sidewalls of the bottom metal lines 344 may be different than the angles of the sidewalls of the top metal lines 350 (e.g., when the angles are measured with respect to planes substantially perpendicular to the support structure 322, shown in FIG. 4D as planes illustrated with dot-dashed lines). For example, the angle between the plane of the dot-dashed line shown in FIG. 4D to be touching the top of the bottom metal line 344-1 and the sidewall of the bottom metal line 344-1 that is shown in FIG. 4D to be closest to this plane may be between about 0 and 10 degrees, e.g., between about 0.5 and 5 degrees, including all values and ranges therein. On the other hand, the angle between the plane of the dot-dashed line shown in FIG. 4D to be touching the top of the top metal line 350-1 and the sidewall of the top metal line 350-1 that is shown in FIG. 4D to be closest to this plane may be between about 2 and 8 degrees, e.g., between about 3 and 5 degrees, including all values and ranges therein. FIG. 4D illustrates an embodiment where said angle associated with the bottom metal line 344-1 is smaller than said angle associated with the top metal line 350-1. However, in other embodiments, this may be reversed, all of which embodiments being within the scope of the present disclosure.

While the trapezoidal shapes of the cross-sectional side views of the bottom metal lines 344 and the top metal lines 350 are shown in FIGS. 4C-4D with precise angles and straight lines, this is simply for ease of illustration, and, in other embodiments, the substantially trapezoidal shapes of the cross-sectional side views of the bottom metal lines 344 and the top metal lines 350 as shown in FIGS. 4C-4D may be curved, rounded, or otherwise irregularly shaped as dictated by, and sometimes inevitable due to, the manufacturing processes used to fabricate semiconductor device assemblies. The same applies to the substantially rectangular shapes of the cross-sectional side views of the bottom metal lines 344 and the top metal lines 350 as shown in FIGS. 3A-3G and FIGS. 4A-4B.

Any of the embodiments described with reference to FIGS. 4C-4D may be combined with any other embodiments described with reference to FIGS. 3A-3H and FIGS. 4A-4B, all of which embodiments being within the scope of the present disclosure.

Example Devices

The IC structures with metallization stacks with self-aligned staggered metal lines integrated in the BEOL, disclosed herein, may be included in any suitable electronic device. FIGS. 5-8 illustrate various examples of apparatuses that may include one or more of the IC structures disclosed herein.

FIGS. 5A-5B are top views of a wafer 2000 and dies 2002 that may include one or more metallization stacks with self-aligned staggered metal lines in accordance with any of the embodiments disclosed herein. In some embodiments, the dies 2002 may be included in an IC package, in accordance with any of the embodiments disclosed herein. For example, any of the dies 2002 may serve as any of the dies 2256 in an IC package 2200 shown in FIG. 6. The wafer 2000 may be composed of semiconductor material and may include one or more dies 2002 having IC structures formed on a surface of the wafer 2000. Each of the dies 2002 may be a repeating unit of a semiconductor product that includes any suitable IC (e.g., ICs including one or more metallization stacks with self-aligned staggered metal lines as described herein). After the fabrication of the semiconductor product is complete (e.g., after manufacture of one or more layers of the metallization stacks with self-aligned staggered metal lines as described herein), the wafer 2000 may undergo a singulation process in which each of the dies 2002 is separated from one another to provide discrete "chips" of the semiconductor product. In particular, devices that include one or more metallization stacks with self-aligned staggered metal lines as disclosed herein may take the form of the wafer 2000 (e.g., not singulated) or the form of the die 2002 (e.g., singulated). The die 2002 may include supporting circuitry to route electrical signals to various memory cells, transistors, capacitors, as well as any other IC components. In some embodiments, the wafer 2000 or the die 2002 may implement or include a memory device (e.g., an SRAM device), a logic device (e.g., an AND, OR, NAND, or NOR gate), or any other suitable circuit element. Multiple ones of these devices may be combined on a single die 2002. For example, a memory array formed by multiple memory devices may be formed on a same die 2002 as a processing device (e.g., the processing device 2402 of FIG. 8) or other logic that is configured to store information in the memory devices or execute instructions stored in the memory array.

Figure 6:
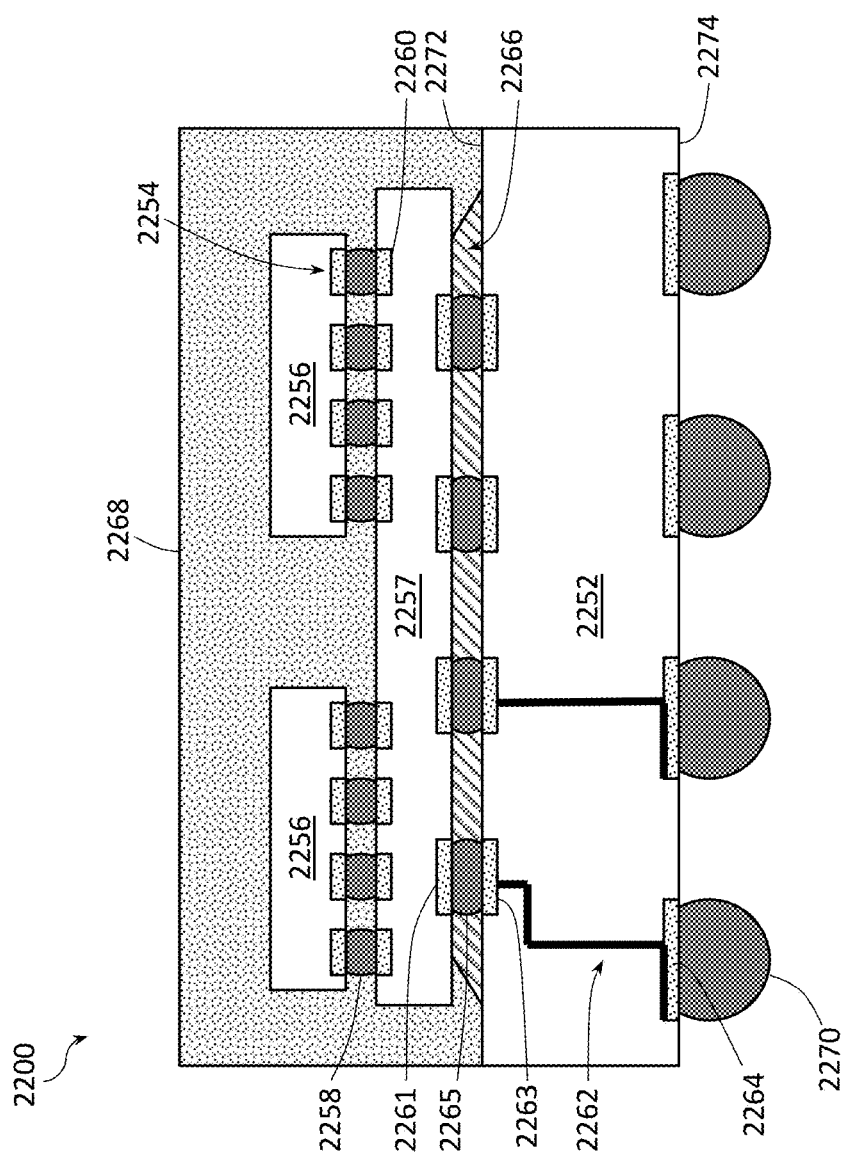
FIG. 6 is a cross-sectional side view of an IC package that may include one or more metallization stacks with self-aligned staggered metal lines, in accordance with various embodiments.

FIG. 6 is a side, cross-sectional view of an example IC package 2200 that may include one or more metallization stacks with self-aligned staggered metal lines in accordance with any of the embodiments disclosed herein. In some embodiments, the IC package 2200 may be a system-in-package (SiP).

The package substrate 2252 may be formed of a dielectric material (e.g., a ceramic, a buildup film, an epoxy film having filler particles therein, etc.), and may have conductive pathways extending through the dielectric material between the face 2272 and the face 2274, or between different locations on the face 2272, and/or between different locations on the face 2274.

The package substrate 2252 may include conductive contacts 2263 that are coupled to conductive pathways 2262 through the package substrate 2252, allowing circuitry within the dies 2256 and/or the interposer 2257 to electrically couple to various ones of the conductive contacts 2264 (or to other devices included in the package substrate 2252, not shown).

The IC package 2200 may include an interposer 2257 coupled to the package substrate 2252 via conductive contacts 2261 of the interposer 2257, first-level interconnects 2265, and the conductive contacts 2263 of the package substrate 2252. The first-level interconnects 2265 illustrated in FIG. 6 are solder bumps, but any suitable first-level interconnects 2265 may be used. In some embodiments, no interposer 2257 may be included in the IC package 2200; instead, the dies 2256 may be coupled directly to the conductive contacts 2263 at the face 2272 by first-level interconnects 2265.

The IC package 2200 may include one or more dies 2256 coupled to the interposer 2257 via conductive contacts 2254 of the dies 2256, first-level interconnects 2258, and conductive contacts 2260 of the interposer 2257. The conductive contacts 2260 may be coupled to conductive pathways (not shown) through the interposer 2257, allowing circuitry within the dies 2256 to electrically couple to various ones of the conductive contacts 2261 (or to other devices included in the interposer 2257, not shown). The first-level interconnects 2258 illustrated in FIG. 6 are solder bumps, but any suitable first-level interconnects 2258 may be used. As used herein, a "conductive contact" may refer to a portion of electrically conductive material (e.g., metal) serving as an interface between different components; conductive contacts may be recessed in, flush with, or extending away from a surface of a component, and may take any suitable form (e.g., a conductive pad or socket).

In some embodiments, an underfill material 2266 may be disposed between the package substrate 2252 and the interposer 2257 around the first-level interconnects 2265, and a mold compound 2268 may be disposed around the dies 2256 and the interposer 2257 and in contact with the package substrate 2252. In some embodiments, the underfill material 2266 may be the same as the mold compound 2268. Example materials that may be used for the underfill material 2266 and the mold compound 2268 are epoxy mold materials, as suitable. Second-level interconnects 2270 may be coupled to the conductive contacts 2264. The second-level interconnects 2270 illustrated in FIG. 6 are solder balls (e.g., for a ball grid array arrangement), but any suitable second-level interconnects 2270 may be used (e.g., pins in a pin grid array arrangement or lands in a land grid array arrangement). The second-level interconnects 2270 may be used to couple the IC package 2200 to another component, such as a circuit board (e.g., a motherboard), an interposer, or another IC package, as known in the art and as discussed below with reference to FIG. 7.

The dies 2256 may take the form of any of the embodiments of the die 2002 discussed herein (e.g., may include any of the embodiments of the metallization stacks with self-aligned staggered metal lines as described herein). In embodiments in which the IC package 2200 includes multiple dies 2256, the IC package 2200 may be referred to as a multi-chip package (MCP). The dies 2256 may include circuitry to perform any desired functionality. For example, one or more of the dies 2256 may be logic dies (e.g., silicon-based dies), and one or more of the dies 2256 may be memory dies (e.g., high bandwidth memory). In some embodiments, any of the dies 2256 may include one or more metallization stacks with self-aligned staggered metal lines as discussed above; in some embodiments, at least some of the dies 2256 may not include any metallization stacks with self-aligned staggered metal lines.

The IC package 2200 illustrated in FIG. 6 may be a flip chip package, although other package architectures may be used. For example, the IC package 2200 may be a ball grid array (BGA) package, such as an embedded wafer-level ball grid array (eWLB) package. In another example, the IC package 2200 may be a wafer-level chip scale package (WLCSP) or a panel fan-out (FO) package. Although two dies 2256 are illustrated in the IC package 2200 of FIG. 6, an IC package 2200 may include any desired number of the dies 2256. An IC package 2200 may include additional passive components, such as surface-mount resistors, capacitors, and inductors disposed on the first face 2272 or the second face 2274 of the package substrate 2252, or on either face of the interposer 2257. More generally, an IC package 2200 may include any other active or passive components known in the art.

Figure 7:
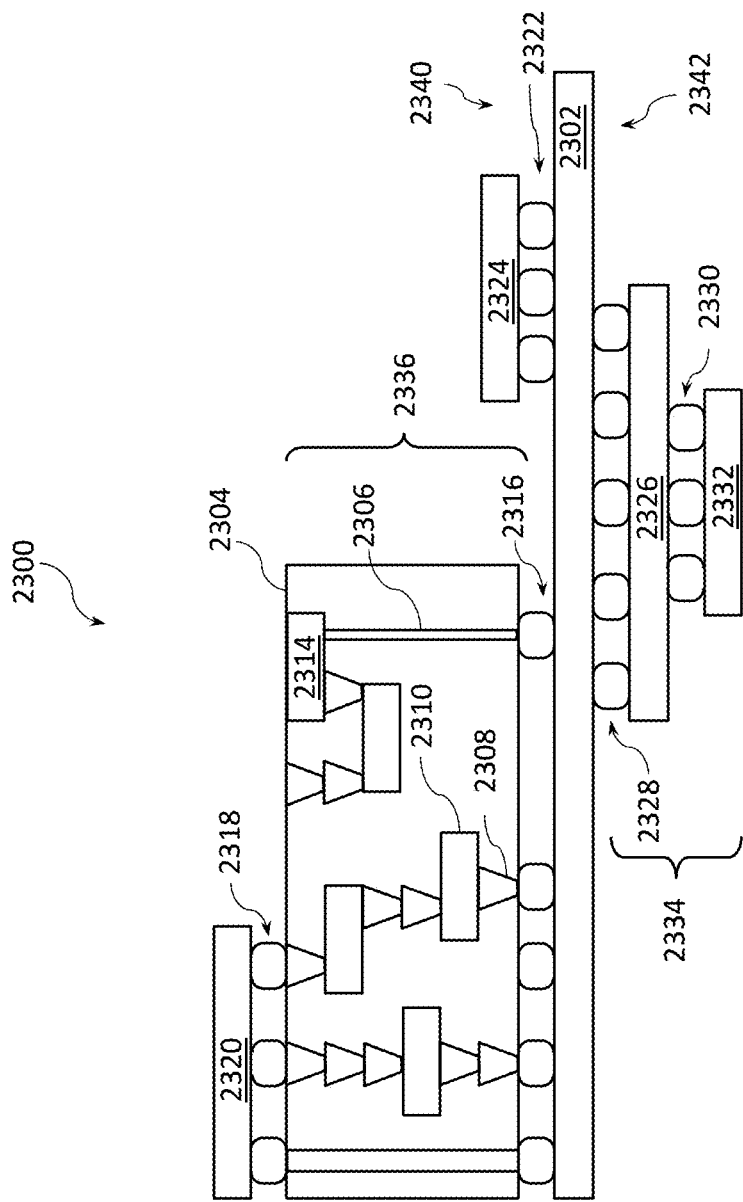
FIG. 7 is a cross-sectional side view of an IC device assembly that may include one or more metallization stacks with self-aligned staggered metal lines, in accordance with various embodiments.

FIG. 7 is a cross-sectional side view of an IC device assembly 2300 that may include components having one or more metallization stacks with self-aligned staggered metal lines in accordance with any of the embodiments disclosed herein. The IC device assembly 2300 includes a number of components disposed on a circuit board 2302 (which may be, e.g., a motherboard). The IC device assembly 2300 includes components disposed on a first face 2340 of the circuit board 2302 and an opposing second face 2342 of the circuit board 2302; generally, components may be disposed on one or both faces 2340 and 2342. In particular, any suitable ones of the components of the IC device assembly 2300 may include any of one or more metallization stacks with self-aligned staggered metal lines in accordance with any of the embodiments disclosed herein; e.g., any of the IC packages discussed below with reference to the IC device assembly 2300 may take the form of any of the embodiments of the IC package 2200 discussed above with reference to FIG. 6 (e.g., may include one or more metallization stacks with self-aligned staggered metal lines provided on a die 2256).

In some embodiments, the circuit board 2302 may be a PCB including multiple metal layers separated from one another by layers of dielectric material and interconnected by electrically conductive vias. Any one or more of the metal layers may be formed in a desired circuit pattern to route electrical signals (optionally in conjunction with other metal layers) between the components coupled to the circuit board 2302. In other embodiments, the circuit board 2302 may be a non-PCB substrate.

The IC device assembly 2300 illustrated in FIG. 7 includes a package-on-interposer structure 2336 coupled to the first face 2340 of the circuit board 2302 by coupling components 2316. The coupling components 2316 may electrically and mechanically couple the package-on-interposer structure 2336 to the circuit board 2302, and may include solder balls (e.g., as shown in FIG. 7), male and female portions of a socket, an adhesive, an underfill material, and/or any other suitable electrical and/or mechanical coupling structure.

The package-on-interposer structure 2336 may include an IC package 2320 coupled to an interposer 2304 by coupling components 2318. The coupling components 2318 may take any suitable form for the application, such as the forms discussed above with reference to the coupling components 2316. The IC package 2320 may be or include, for example, a die (the die 2002 of FIG. 5B), an IC device, or any other suitable component. In particular, the IC package 2320 may include one or more metallization stacks with self-aligned staggered metal lines as described herein. Although a single IC package 2320 is shown in FIG. 7, multiple IC packages may be coupled to the interposer 2304; indeed, additional interposers may be coupled to the interposer 2304. The interposer 2304 may provide an intervening substrate used to bridge the circuit board 2302 and the IC package 2320. Generally, the interposer 2304 may spread a connection to a wider pitch or reroute a connection to a different connection. For example, the interposer 2304 may couple the IC package 2320 (e.g., a die) to a BGA of the coupling components 2316 for coupling to the circuit board 2302. In the embodiment illustrated in FIG. 7, the IC package 2320 and the circuit board 2302 are attached to opposing sides of the interposer 2304; in other embodiments, the IC package 2320 and the circuit board 2302 may be attached to a same side of the interposer 2304. In some embodiments, three or more components may be interconnected by way of the interposer 2304.

The interposer 2304 may be formed of an epoxy resin, a fiberglass-reinforced epoxy resin, a ceramic material, or a polymer material such as polyimide. In some implementations, the interposer 2304 may be formed of alternate rigid or flexible materials that may include the same materials described above for use in a semiconductor substrate, such as silicon, germanium, and other group III-V and group IV materials. The interposer 2304 may include metal interconnects 2308 and vias 2310, including but not limited to through-silicon vias (TSVs) 2306. The interposer 2304 may further include embedded devices 2314, including both passive and active devices. Such devices may include, but are not limited to, capacitors, decoupling capacitors, resistors, inductors, fuses, diodes, transformers, sensors, electrostatic discharge (ESD) protection devices, and memory devices. More complex devices such as radio frequency (RF) devices, power amplifiers, power management devices, antennas, arrays, sensors, and microelectromechanical systems (MEMS) devices may also be formed on the interposer 2304. The package-on-interposer structure 2336 may take the form of any of the package-on-interposer structures known in the art.

The IC device assembly 2300 may include an IC package 2324 coupled to the first face 2340 of the circuit board 2302 by coupling components 2322. The coupling components 2322 may take the form of any of the embodiments discussed above with reference to the coupling components 2316, and the IC package 2324 may take the form of any of the embodiments discussed above with reference to the IC package 2320.

The IC device assembly 2300 illustrated in FIG. 7 includes a package-on-package structure 2334 coupled to the second face 2342 of the circuit board 2302 by coupling components 2328. The package-on-package structure 2334 may include an IC package 2326 and an IC package 2332 coupled together by coupling components 2330 such that the IC package 2326 is disposed between the circuit board 2302 and the IC package 2332. The coupling components 2328 and 2330 may take the form of any of the embodiments of the coupling components 2316 discussed above, and the IC packages 2326 and 2332 may take the form of any of the embodiments of the IC package 2320 discussed above. The package-on-package structure 2334 may be configured in accordance with any of the package-on-package structures known in the art.

Figure 8:
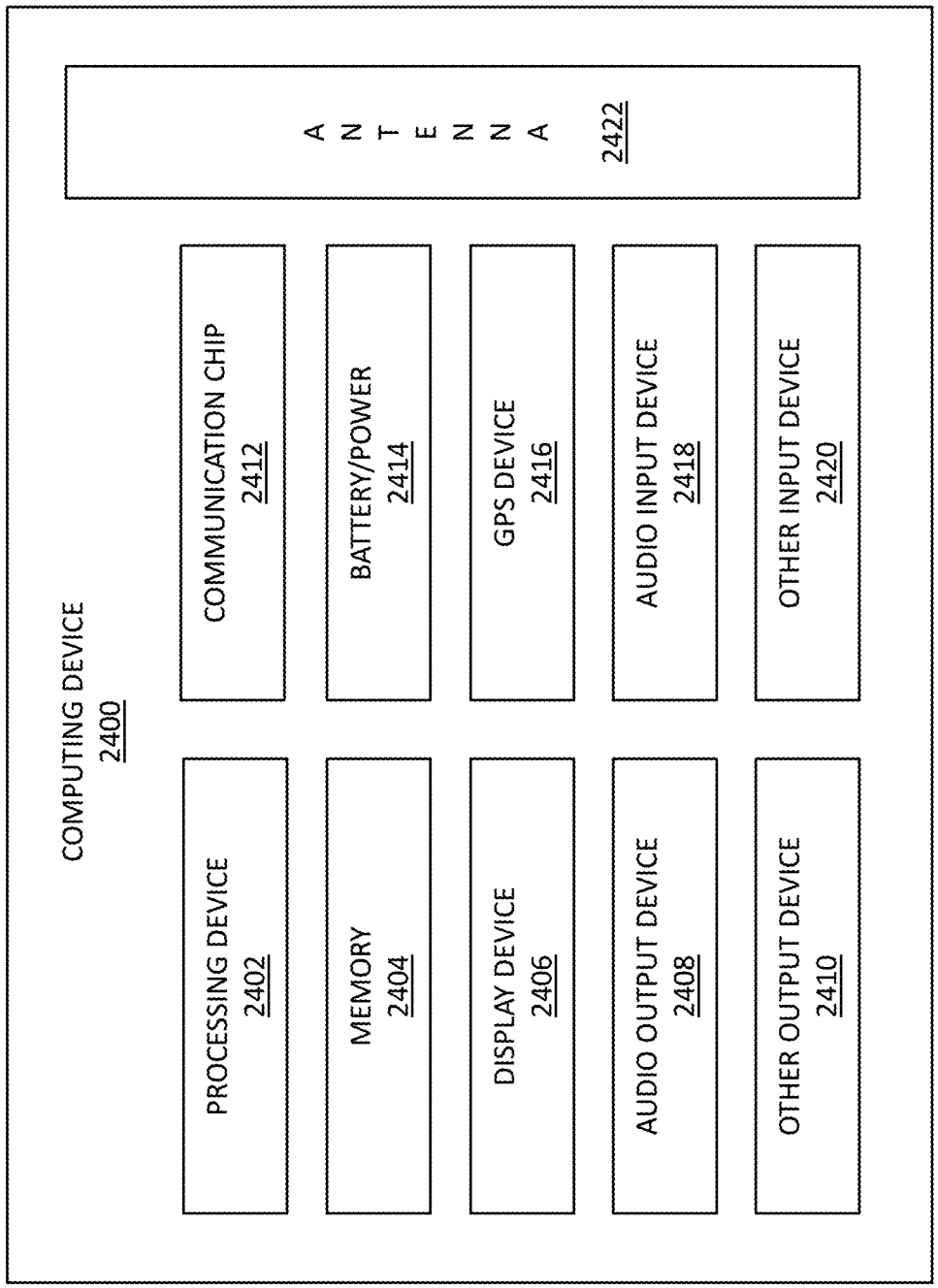
FIG. 8 is a block diagram of an example computing device that may include one or more metallization stacks with self-aligned staggered metal lines, in accordance with various embodiments.

FIG. 8 is a block diagram of an example computing device 2400 that may include one or more components with one or more metallization stacks with self-aligned staggered metal lines in accordance with any of the embodiments disclosed herein. For example, any suitable ones of the components of the computing device 2400 may include a die (e.g., the die 2002, shown in FIG. 5B) including one or more metallization stacks with self-aligned staggered metal lines in accordance with any of the embodiments disclosed herein. Any of the components of the computing device 2400 may include an IC package 2200 (e.g., as shown in FIG. 6). Any of the components of the computing device 2400 may include an IC device assembly 2300 (e.g., as shown in FIG. 7).

A number of components are illustrated in FIG. 8 as included in the computing device 2400, but any one or more of these components may be omitted or duplicated, as suitable for the application. In some embodiments, some or all of the components included in the computing device 2400 may be attached to one or more motherboards. In some embodiments, some or all of these components are fabricated onto a single SoC die.

Additionally, in various embodiments, the computing device 2400 may not include one or more of the components illustrated in FIG. 8, but the computing device 2400 may include interface circuitry for coupling to the one or more components. For example, the computing device 2400 may not include a display device 2406, but may include display device interface circuitry (e.g., a connector and driver circuitry) to which a display device 2406 may be coupled. In another set of examples, the computing device 2400 may not include an audio input device 2418 or an audio output device 2408, but may include audio input or output device interface circuitry (e.g., connectors and supporting circuitry) to which an audio input device 2418 or audio output device 2408 may be coupled.

The computing device 2400 may include a processing device 2402 (e.g., one or more processing devices). As used herein, the term "processing device" or "processor" may refer to any device or portion of a device that processes electronic data from registers and/or memory to transform that electronic data into other electronic data that may be stored in registers and/or memory. The processing device 2402 may include one or more digital signal processors (DSPs), application-specific ICs (ASICs), central processing units (CPUs), graphics processing units (GPUs), cryptoprocessors (specialized processors that execute cryptographic algorithms within hardware), server processors, or any other suitable processing devices. The computing device 2400 may include a memory 2404, which may itself include one or more memory devices such as volatile memory (e.g., DRAM), nonvolatile memory (e.g., read-only memory (ROM)), flash memory, solid state memory, and/or a hard drive. In some embodiments, the memory 2404 may include memory that shares a die with the processing device 2402.

In some embodiments, the computing device 2400 may include a communication chip 2412 (e.g., one or more communication chips). For example, the communication chip 2412 may be configured for managing wireless communications for the transfer of data to and from the computing device 2400. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not.

The communication chip 2412 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultramobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 2412 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 2412 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 2412 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication chip 2412 may operate in accordance with other wireless protocols in other embodiments. The computing device 2400 may include an antenna 2422 to facilitate wireless communications and/or to receive other wireless communications (such as AM or FM radio transmissions).

In some embodiments, the communication chip 2412 may manage wired communications, such as electrical, optical, or any other suitable communication protocols (e.g., the Ethernet). As noted above, the communication chip 2412 may include multiple communication chips. For instance, a first communication chip 2412 may be dedicated to shorter-range wireless communications such as Wi-Fi or Bluetooth, and a second communication chip 2412 may be dedicated to longer-range wireless communications such as global positioning system (GPS), EDGE, GPRS, CDMA, WiMAX, LTE, EV-DO, or others. In some embodiments, a first communication chip 2412 may be dedicated to wireless communications, and a second communication chip 2412 may be dedicated to wired communications.

The computing device 2400 may include battery/power circuitry 2414. The battery/power circuitry 2414 may include one or more energy storage devices (e.g., batteries or capacitors) and/or circuitry for coupling components of the computing device 2400 to an energy source separate from the computing device 2400 (e.g., AC line power).

The computing device 2400 may include a display device 2406 (or corresponding interface circuitry, as discussed above). The display device 2406 may include any visual indicators, such as a heads-up display, a computer monitor, a projector, a touchscreen display, a liquid crystal display (LCD), a light-emitting diode display, or a flat panel display, for example.

The computing device 2400 may include an audio output device 2408 (or corresponding interface circuitry, as discussed above). The audio output device 2408 may include any device that generates an audible indicator, such as speakers, headsets, or earbuds, for example.

The computing device 2400 may include an audio input device 2418 (or corresponding interface circuitry, as discussed above). The audio input device 2418 may include any device that generates a signal representative of a sound, such as microphones, microphone arrays, or digital instruments (e.g., instruments having a musical instrument digital interface (MIDI) output).

The computing device 2400 may include a GPS device 2416 (or corresponding interface circuitry, as discussed above). The GPS device 2416 may be in communication with a satellite-based system and may receive a location of the computing device 2400, as known in the art.

The computing device 2400 may include an other output device 2410 (or corresponding interface circuitry, as discussed above). Examples of the other output device 2410 may include an audio codec, a video codec, a printer, a wired or wireless transmitter for providing information to other devices, or an additional storage device.

The computing device 2400 may include an other input device 2420 (or corresponding interface circuitry, as discussed above). Examples of the other input device 2420 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

The computing device 2400 may have any desired form factor, such as a handheld or mobile computing device (e.g., a cell phone, a smart phone, a mobile internet device, a music player, a tablet computer, a laptop computer, a netbook computer, an ultrabook computer, a personal digital assistant (PDA), an ultramobile personal computer, etc.), a desktop computing device, a server or other networked computing component, a printer, a scanner, a monitor, a set-top box, an entertainment control unit, a vehicle control unit, a digital camera, a digital video recorder, or a wearable computing device. In some embodiments, the computing device 2400 may be any other electronic device that processes data.

Select Examples

The following paragraphs provide various examples of the embodiments disclosed herein.

Example 1 provides am IC structure that includes a support structure (e.g., a support structure 322, shown in the present drawings, e.g., a substrate); a first metallization layer (e.g., a metallization layer 110, shown in the present drawings), including a pair of first electrically conductive lines (e.g., metal lines 112-1 and 112-2, shown in the present drawings); and a second metallization layer (e.g., a metallization layer 120, shown in the present drawings), including a second electrically conductive line (e.g., a metal lines 122-1, shown in the present drawings) and an interconnect (e.g., an interconnect 124, shown in the present drawings) configured to provide electrical connectivity between the second electrically conductive line and one of the first electrically conductive lines (e.g., a metal lines 112-1, shown in the present drawings). The first metallization layer is between the support structure and the second metallization layer (i.e., the second metallization layer is stacked above the first metallization layer). The interconnect is electrically coupled to the one of the first electrically conductive lines and to a sidewall (i.e., a face that is substantially perpendicular to the support structure) of the second electrically conductive line. Projections of the pair of the first electrically conductive lines and of the second electrically conductive line onto the support structure are substantially parallel, and the projection of the second electrically conductive line is between the projections of the pair of the first electrically conductive lines (i.e., the second electrically conductive line is staggered with respect to the pair of the first electrically conductive lines).

Example 2 provides the IC structure according to example 1, where a lower face of the interconnect and a lower face of the second electrically conductive line are in a single first plane that is substantially parallel to the support structure. Thus, the bottom of the interconnect may be aligned with the bottom of the second electrically conductive line to which the interconnect is electrically coupled to, and may be coupled to the upper face of the one of the first electrically conductive lines to which the interconnect is electrically coupled to.

Example 3 provides the IC structure according to example 1, where a lower face of the interconnect is closer to the support structure than an upper face of the one of the first electrically conductive lines to which the interconnect is electrically coupled to.

Example 4 provides the IC structure according to example 3, where a portion of the interconnect at least partially wraps around (i.e., interfaces at least a portion of an upper face and at least a portion of a sidewall of) a portion of the one of the first electrically conductive lines. Such an embodiment may advantageously result in lowered resistance between the interconnect and the one of the first electrically conductive lines to which the interconnect is coupled to by increasing the area of their overlap.

Example 5 provides the IC structure according to any one of the preceding examples, where an upper face of the interconnect and an upper face of the second electrically conductive line are in a single second plane that is substantially parallel to the support structure. Thus, the top of the interconnect may be aligned with the top of the second electrically conductive lines to which the interconnect is electrically coupled to.

Example 6 provides the IC structure according to any one of the preceding examples, where an upper face of each of the first electrically conductive lines and a lower face of the second electrically conductive line are in a single first plane that is substantially parallel to the support structure. In other examples, the upper face(s) of the first electrically conductive lines and the lower face of the second electrically conductive line may be in different planes, e.g., the lower face of the second electrically conductive line may be closer to the support structure than the upper face(s) of the first electrically conductive lines, or the lower face of the second electrically conductive line may be farther away from the support structure than the upper face(s) of the first electrically conductive lines.

Example 7 provides the IC structure according to any one of the preceding examples, where a distance (e.g., a distance 332-1 shown in FIG. 3G) between a plane that is substantially perpendicular to the support structure and is a plane of symmetry for (i.e., in the center of) the second electrically conductive line and a plane that is substantially perpendicular to the support structure and is a plane of symmetry for a first one of the pair of the first electrically conductive lines is substantially equal to a distance (e.g., a distance 332-2 shown in FIG. 3G) between the plane that is substantially perpendicular to the support structure and is the plane of symmetry for the second electrically conductive line and a plane that is substantially perpendicular to the support structure and is a plane of symmetry for a second one of the pair of the first electrically conductive lines. Thus, the second electrically conductive line is self-aligned in between the pair of the first electrically conductive lines.

Example 8 provides the IC structure according to any one of the preceding examples, where a distance (e.g., a distance 336-1 shown in FIG. 3G) between the projection of the second electrically conductive line and the projection of a first one of the pair of the first electrically conductive lines is substantially equal to or smaller than a height (e.g., a distance 334 shown in FIG. 3G) of the pair of the first electrically conductive lines.

Example 9 provides the IC structure according to any one of the preceding examples, where a height (e.g., a distance 338 shown in FIG. 3G) of the second electrically conductive line is substantially equal to or smaller than a height (e.g., a distance 334 shown in FIG. 3G) of the pair of the first electrically conductive lines.

Example 10 provides the IC structure according to any one of the preceding examples, where a width of at least a first one of the pair of the first electrically conductive lines in a first plane that is substantially parallel to the support structure is greater than a width of the first one of the pair of the first electrically conductive lines in a second plane that is substantially parallel to the support structure, where the first plane is between the support structure and the second plane (e.g., the first plane may be closer to, or at, the bottom of the first electrically conductive line and the second plane may be closer to, or at, the top of the first electrically conductive line).

Example 11 provides the IC structure according to any one of the preceding examples, where a width of the second electrically conductive line in a first plane that is substantially parallel to the support structure is smaller than a width of the second electrically conductive line in a second plane that is substantially parallel to the support structure, where the first plane is between the support structure and the second plane (e.g., the first plane may be closer to, or at, the bottom of the second electrically conductive line and the second plane may be closer to, or at, the top of the second electrically conductive line).

Example 12 provides the IC structure according to any one of the preceding examples, where a width of at least a first one of the pair of the first electrically conductive lines in a third plane that is substantially parallel to the support structure is smaller than a width of the first one of the pair of the first electrically conductive lines in a fourth plane that is substantially parallel to the support structure, where the third plane is between the support structure and the fourth plane (e.g., the third plane may be closer to, or at, the bottom of the first electrically conductive line and the fourth plane may be closer to, or at, the top of the first electrically conductive line).

Example 13 provides the IC structure according to example 12, where an angle of a sidewall of at least a first one of the first electrically conductive lines with respect to a plane substantially perpendicular to the support structure is different from an angle of a sidewall of the second electrically conductive line with respect to the plane substantially perpendicular to the support structure. In some embodiments, the former angle may be smaller than the latter angle.

Example 14 provides the IC structure according to any one of the preceding examples, where a dimension of the interconnect measured in a plane substantially perpendicular to the support structure is smaller than a dimension of the interconnect measured in a plane substantially parallel to the support structure. Thus, the interconnect may be referred to as a "horizontal via."

Example 15 provides an IC structure that includes a support structure (e.g., a support structure 322, shown in the present drawings, e.g., a substrate); a first metallization layer (e.g., a metallization layer 110, shown in the present drawings), including a pair of first electrically conductive lines (e.g., metal lines 112-1 and 112-2, shown in the present drawings); and a second metallization layer (e.g., a metallization layer 120, shown in the present drawings), including a second electrically conductive line (e.g., a metal lines 122-1, shown in the present drawings). In such an IC structure, the first metallization layer is between the support structure and the second metallization layer (i.e., the second metallization layer is stacked above the first metallization layer), projections of the pair of the first electrically conductive lines and of the second electrically conductive line onto the support structure are substantially parallel, the projection of the second electrically conductive line is between the projections of the pair of the first electrically conductive lines (i.e., the second electrically conductive line is staggered with respect to the first electrically conductive lines), and a distance (e.g., a distance 332-1 shown in FIG. 3G) between a plane that is substantially perpendicular to the support structure and is a plane of symmetry for (i.e., in the center of) the second electrically conductive line and a plane that is substantially perpendicular to the support structure and is a plane of symmetry for a first one of the pair of the first electrically conductive lines is substantially equal to a distance (e.g., a distance 332-2 shown in FIG. 3G) between the plane that is substantially perpendicular to the support structure and is the plane of symmetry for the second electrically conductive line and a plane that is substantially perpendicular to the support structure and is a plane of symmetry for a second one of the pair of the first electrically conductive lines. Thus, the second electrically conductive line is self-aligned in between the pair of the first electrically conductive lines.

Example 16 provides the IC structure according to example 15, further including a continuous spacer material surrounding and being in contact with each of the pair of the first electrically conductive lines and the second electrically conductive line.

Example 17 provides the IC structure according to examples 15 or 16, where a width of at least a first one of the pair of the first electrically conductive lines in a first plane that is substantially parallel to the support structure is greater than a width of the first one of the pair of the first electrically conductive lines in a second plane that is substantially parallel to the support structure, where the first plane is between the support structure and the second plane (e.g., the first plane may be closer to, or at, the bottom of the first electrically conductive line and the second plane may be closer to, or at, the top of the first electrically conductive line).

Example 18 provides the IC structure according to any one of examples 15-17, where a width of the second electrically conductive line in a first plane that is substantially parallel to the support structure is smaller than a width of the second electrically conductive line in a second plane that is substantially parallel to the support structure, where the first plane is between the support structure and the second plane (e.g., the first plane may be closer to, or at, the bottom of the second electrically conductive line and the second plane may be closer to, or at, the top of the second electrically conductive line).

Example 19 provides the IC structure according to any one of the preceding examples, where the pair of the first electrically conductive lines are two of a plurality of first electrically conductive lines, the second electrically conductive line is one of a plurality of second electrically conductive lines, and a pitch between every pair of adjacent first electrically conductive lines is substantially equal to a pitch between every pair of adjacent second electrically conductive lines.

Example 20 provides the IC structure according to example 19, where, for each of the second electrically conductive lines, distances from the second electrically conductive line to two nearest first electrically conductive lines are substantially the same.

Example 21 provides the IC structure according to examples 19 or 20, where the plurality of second electrically conductive lines are staggered with respect to the plurality of first electrically conductive lines in that projections of the plurality of second electrically conductive lines onto the support structure do not overlap with projections of the plurality of first electrically conductive lines onto the support structure.

Example 22 provides the IC structure according to any one of the preceding examples, where the projection of the second electrically conductive line is substantially in the middle between the projections of the pair of the first electrically conductive lines.

Example 23 provides a method of fabricating an IC structure. The method includes providing, over a support structure (e.g., a support structure 322, shown in the present drawings, e.g., a substrate), a plurality of first electrically conductive lines (e.g., metal lines 112-1 and 112-2, shown in the present drawings) formed of a first electrically conductive material; performing conformal deposition to providing a layer of a spacer material conformal to the plurality of first electrically conductive lines so that, for each pair of adjacent first electrically conductive lines of the plurality of first electrically conductive lines, an opening in the spacer material is formed, the opening being substantially equidistant to the adjacent first electrically conductive lines; and providing a plurality of second electrically conductive lines formed of a second electrically conductive material by filling the opening with the second electrically conductive material for the each pair of adjacent first electrically conductive lines.

Example 24 provides the method according to example 23, where, for each pair of adjacent first electrically conductive lines, a bottom of the opening is not closer to the support structure than top faces of the plurality of first electrically conductive lines.

Example 25 provides the method according to examples 23 or 24, further including steps for forming the IC structure according to any one of the preceding examples (e.g., the IC structure according to any one of examples 1-22).

Example 26 provides an IC package that includes an IC die that includes an IC structure according to any one of the preceding examples (e.g., the IC structure according to any one of examples 1-22 and/or an IC structure formed according to the method according to any one of examples 23-25) and a further IC component, coupled to the IC die.

Example 27 provides the IC package according to example 26, where the further component is one of a package substrate, a flexible substrate, or an interposer.

Example 28 provides the IC package according to examples 26 or 27, where the further component is coupled to the IC die via one or more first level interconnects.

Example 29 provides the IC package according to example 28, where the one or more first level interconnects include one or more solder bumps, solder posts, or bond wires.

Example 30 provides a computing device that includes a circuit board; and an IC die coupled to the circuit board, where the IC die includes one or more of: 1) one or more of the IC structures according to any one of claims 1-22, 2) one or more of the IC structures formed according to the method according to any one of claims 23-25, and 3) one or more of IC packages according to any one of the preceding examples (e.g., each IC package may be an IC package according to any one of examples 26-29).

Example 31 provides the computing device according to example 30, where the computing device is a wearable computing device (e.g., a smart watch) or handheld computing device (e.g., a mobile phone).

Example 32 provides the computing device according to examples 30 or 31, where the computing device is a server processor.

Example 33 provides the computing device according to examples 30 or 31, where the computing device is a motherboard.

Example 34 provides the computing device according to any one of examples 30-33, where the computing device further includes one or more communication chips and an antenna.

The above description of illustrated implementations of the disclosure, including what is described in the Abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize. These modifications may be made to the disclosure in light of the above detailed description.

The invention claimed is:
1. An integrated circuit (IC) structure, comprising:
a support structure;
a first metallization layer, comprising two first electrically conductive lines; and a second metallization layer, comprising a second electrically conductive line and an interconnect coupled to a sidewall of the second electrically conductive line and one of the two first electrically conductive lines,
wherein:
the first metallization layer is between the support structure and the second metallization layer,
projections of the two first electrically conductive lines and of the second electrically conductive line onto the support structure are substantially parallel,
the projection of the second electrically conductive line is between the projections of the two first electrically conductive lines, and
a lower face of the interconnect and a lower face of the second electrically conductive line are in a single first plane that is substantially parallel to the support structure.

2. The IC structure according to claim 1, wherein an upper face of the interconnect and an upper face of the second electrically conductive line are in a single second plane that is substantially parallel to the support structure.

3. The IC structure according to claim 1, wherein a distance between a plane that is substantially perpendicular to the support structure and is a plane of symmetry for the second electrically conductive line and a plane that is substantially perpendicular to the support structure and is a plane of symmetry for a first one of the two first electrically conductive lines is substantially equal to a distance between the plane that is substantially perpendicular to the support structure and is the plane of symmetry for the second electrically conductive line and a plane that is substantially perpendicular to the support structure and is a plane of symmetry for a second one of the two first electrically conductive lines.

4. The IC structure according to claim 1, wherein a distance between the projection of the second electrically conductive line and the projection of a first one of the two first electrically conductive lines is substantially equal to or smaller than a height of the two first electrically conductive lines.

5. The IC structure according to claim 1, wherein a height of the second electrically conductive line is substantially equal to or smaller than a height of the two first electrically conductive lines.

6. The IC structure according to claim 1, wherein a width of at least a first one of the two first electrically conductive lines in a first plane that is substantially parallel to the support structure is greater than a width of the first one of the two first electrically conductive lines in a second plane that is substantially parallel to the support structure, where the first plane is between the support structure and the second plane.

7. The IC structure according to claim 1, wherein a width of the second electrically conductive line in a first plane that is substantially parallel to the support structure is smaller than a width of the second electrically conductive line in a second plane that is substantially parallel to the support structure, where the first plane is between the support structure and the second plane.

8. The IC structure according to claim 7, wherein a width of at least a first one of the two first electrically conductive lines in a third plane that is substantially parallel to the support structure is smaller than a width of the first one of the two first electrically conductive lines in a fourth plane that is substantially parallel to the support structure, where the third plane is between the support structure and the fourth plane.

9. The IC structure according to claim 8, wherein an angle of a sidewall of at least a first one of the first electrically conductive lines with respect to a plane substantially perpendicular to the support structure is different from an angle of a sidewall of the second electrically conductive line with respect to the plane substantially perpendicular to the support structure.

10. An integrated circuit (IC) structure, comprising:
a device layer;
a first layer, comprising a first conductive line; and
a second layer, comprising a second conductive line and an interconnect,
wherein:
the first layer is between the device layer and the second layer,
the interconnect has a first end and an opposing second end,
the interconnect has a lower face and an opposing upper face,
a portion of the lower face at the first end of the interconnect is in direct contact with an upper face of the first conductive line,
the second end of the interconnect is in direct contact with a sidewall of the second conductive line,
projections of the first conductive line and the second conductive line onto the device layer are substantially parallel,
the projection of the second conductive line is at a distance from the projection of the first conductive line, and
a projection of the interconnect is perpendicular to the projection of the second conductive line.

11. The IC structure according to claim 10, further comprising a continuous insulator material surrounding and being in contact with each of the first conductive line and the second conductive line.

12. The IC structure according to claim 10, wherein a width of the first conductive line in a first plane that is substantially parallel to the device layer is greater than a width of the first conductive line in a second plane that is substantially parallel to the device layer, where the first plane is between the device layer and the second plane.

13. The IC structure according to claim 10, wherein a width of the second conductive line in a first plane that is substantially parallel to the device layer is smaller than a width of the second conductive line in a second plane that is substantially parallel to the device layer, where the first plane is between the device layer and the second plane.

14. The IC structure according to claim 10, wherein:
the first conductive line is one of a plurality of first conductive lines,
the second conductive line is one of a plurality of second conductive lines, and
a pitch between a pair of adjacent first conductive lines is substantially equal to a pitch between a pair of adjacent second conductive lines.

15. The IC structure according to claim 10, wherein a portion of the lower face of the interconnect is closer to the device layer than the upper face of the first conductive line.

16. The IC structure according to claim 10, wherein a portion of the interconnect is in contact with a portion of a sidewall of the first conductive line.

17. An integrated circuit (IC) structure, comprising:
a first metal layer, comprising a first conductive line; and
a second metal layer stacked above the first metal layer, the second metal layer comprising a second conductive line and an interconnect, wherein:
> projections of the first conductive line and the second conductive line onto a plane parallel to the second metal layer are substantially parallel and are at a distance from one another,
>
> a first portion of the interconnect is in direct contact with an upper face of the first conductive line,
>
> a second portion of the interconnect is in direct contact with a sidewall of the second conductive line, and
>
> an upper face of the interconnect is aligned with an upper face of the second conductive line.

18. The IC structure according to claim 17, wherein a lower face of the interconnect is aligned with a lower face of the second conductive line.

19. The IC structure according to claim 17, wherein, in the second metal layer, the interconnect is substantially perpendicular to the second conductive line.

20. The IC structure according to claim 15, wherein a portion of the interconnect at least partially wraps around a portion of the first conductive line.

21. The IC structure according to claim 17, wherein a further portion of the interconnect at least partially wraps around a portion of the first conductive line.

22. The IC structure according to claim 17, wherein a further portion of the interconnect is in contact with a portion of a sidewall of the first conductive line.

* * * * *